United States Patent
Lin et al.

(10) Patent No.: US 9,209,154 B2
(45) Date of Patent: *Dec. 8, 2015

(54) SEMICONDUCTOR PACKAGE WITH PACKAGE-ON-PACKAGE STACKING CAPABILITY AND METHOD OF MANUFACTURING THE SAME

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/558,740

(22) Filed: Dec. 3, 2014

(65) Prior Publication Data

US 2015/0155256 A1    Jun. 4, 2015

Related U.S. Application Data

(60) Provisional application No. 61/911,562, filed on Dec. 4, 2013.

(51) Int. Cl.
    H01L 21/768    (2006.01)
    H01L 23/00     (2006.01)

(52) U.S. Cl.
    CPC .......... *H01L 24/81* (2013.01); *H01L 21/76877* (2013.01); *H01L 24/17* (2013.01); *H01L 24/19* (2013.01); *H01L 24/25* (2013.01); *H01L 24/97* (2013.01); *H01L 24/13* (2013.01); *H01L 24/16* (2013.01); *H01L 24/73* (2013.01); *H01L 2224/13101* (2013.01); *H01L 2224/16225* (2013.01); *H01L 2224/32225* (2013.01); *H01L 2224/73204* (2013.01); *H01L 2224/73253* (2013.01); *H01L 2224/81203* (2013.01); *H01L 2224/81207* (2013.01); *H01L 2224/81815* (2013.01); *H01L 2224/92125* (2013.01); *H01L 2924/15173* (2013.01); *H01L 2924/16195* (2013.01); *H01L 2924/171* (2013.01); *H01L 2924/37001* (2013.01)

(58) Field of Classification Search
    CPC ......... H01L 24/17; H01L 24/19; H01L 24/25; H01L 24/81; H01L 24/97; H01L 21/76877
    See application file for complete search history.

(56) References Cited

U.S. PATENT DOCUMENTS

| | | | |
|---|---|---|---|
| 5,432,677 A | 7/1995 | Mowatt et al. | |
| 6,590,291 B2 | 7/2003 | Akagawa | |
| 6,909,054 B2 | 6/2005 | Sakamoto et al. | |
| 8,106,504 B2 * | 1/2012 | Yang | H01L 23/481 257/684 |

(Continued)

*Primary Examiner* — Allan R Wilson
(74) *Attorney, Agent, or Firm* — Pai Patent & Trademark Law Firm; Chao-Chang David Pai

(57) ABSTRACT

A method of making a semiconductor package with package-on-package stacking capability is characterized by the step of attaching a chip-on-interposer subassembly on a base carrier with the chip inserted into a through opening of the base carrier and the interposer laterally extending beyond the through opening. The interposer provides primary fan-out routing for the chip whereas dual buildup circuitries formed on both opposite sides of the base carrier provides further fan-out routing and are electrically connected to each other by plated through holes to provide the package with stacking capacity.

12 Claims, 19 Drawing Sheets

(56) References Cited

U.S. PATENT DOCUMENTS

| | | | |
|---|---|---|---|
| 8,410,595 B2* | 4/2013 | Kroehnert | H01L 21/4871 257/686 |
| 8,410,614 B2 | 4/2013 | Kunimoto | |
| 8,501,544 B2 | 8/2013 | Pagaila | |
| 8,643,164 B2* | 2/2014 | Kaufmann | H01L 23/5389 257/686 |
| 8,653,626 B2* | 2/2014 | Lo | H01L 23/49816 257/532 |
| 8,736,073 B2 | 5/2014 | Kunimoto | |
| 8,786,103 B2 | 7/2014 | Uchiyama et al. | |
| 8,823,187 B2 | 9/2014 | Shimizu et al. | |
| 2010/0013081 A1* | 1/2010 | Toh | H01L 23/49816 257/692 |
| 2010/0072606 A1* | 3/2010 | Yang | H01L 23/481 257/692 |
| 2010/0301474 A1* | 12/2010 | Yang | H01L 21/6835 257/737 |
| 2011/0195546 A1* | 8/2011 | Yang | H01L 23/481 438/118 |
| 2012/0074580 A1* | 3/2012 | Nalla | H01L 21/568 257/774 |
| 2013/0249106 A1 | 9/2013 | Lin et al. | |
| 2014/0021583 A1* | 1/2014 | Lo | H01L 23/49816 257/532 |
| 2014/0210099 A1* | 7/2014 | Hu | H01L 24/19 257/774 |
| 2015/0011083 A1* | 1/2015 | Tsai | H01L 23/481 438/631 |
| 2015/0130046 A1 | 5/2015 | Lin et al. | |
| 2015/0137338 A1* | 5/2015 | Lin | H01L 23/49816 257/676 |

* cited by examiner

US 9,209,154 B2

SEMICONDUCTOR PACKAGE WITH PACKAGE-ON-PACKAGE STACKING CAPABILITY AND METHOD OF MANUFACTURING THE SAME

CROSS REFERENCE TO RELATED APPLICATIONS

This application claims the benefit of filing date of U.S. Provisional Application Ser. No. 61/911,562 filed Dec. 4, 2013. The entirety of said Provisional application is incorporated herein by reference.

FIELD OF THE INVENTION

The present invention relates to a semiconductor package with package-on-package stacking capability, more particularly, to a stackable semiconductor package having a semiconductor device positioned in a through opening of a base carrier and electrically connected to an interposer, and a method of making the same.

DESCRIPTION OF RELATED ART

The convergence of mobility, communication, and computing has created significant thermal, electrical and reliability challenges to the semiconductor packaging industry. Despite numerous package-on-package assemblies reported in the literature, many manufacturing yield-related deficiencies remain. For example, the package-on-package assemblies disclosed in U.S. Patent Publication No. 2013/0249106 and U.S. Pat. Nos. 5,432,677, 6,590,291, 6,909,054, 8,410, 614, 8,736,073, 8,786,103 and 8,823,187 utilize laser or photo-imaging process to form micro-vias directly on the I/O pads of embedded chip so as to electrically connect the chip and build-up circuitry. However, with the advances of chip fabrication technologies, the number of I/O pads steadily increases and the I/O pad spacing (pitch) decreases accordingly. As a result, the use of the micro-via approach presents a crowding problem which can cause shorting between the neighboring micro-vias.

Another significant drawback arising from the fabrication of the above assemblies is that the embedded chip may dislocate during encapsulation or lamination. Incomplete metallization of micro-vias due to chip dislocation as described in U.S. Pat. No. 8,501,544 further degrades the quality of the electrical connection, thereby lowering the reliability and production yield of the fabricated assembly.

For the reasons stated above, and for other reasons stated below, an urgent need exists to develop a new apparatus and method to interconnect embedded chip without using micro-vias at I/O pads to improve chip-level reliability, and avoid the semiconductor chip I/O pad crowding problem that creates enormous concerns in device reliability and low manufacturing yield.

SUMMARY OF THE INVENTION

A primary objective of the present invention is to provide a semiconductor package for package-on-package stacking in which a chip-on-interposer subassembly is configured wherein a chip or a 3D-stacked chip is assembled to a interposer by a plurality of bumps so as to avoid laser or photo-imaging process directly acting on chip I/O pads, thereby improving the production yield and reliability of the semiconductor package.

Another objective of the present invention is to provide a semiconductor package for package-on-package stacking in which an interposer is used to provide fan-out routing for the chip attached thereon. As the chip is electrically connected to one side of the interposer for fan-out through the interposer, a buildup circuitry can be connected to another side of the interposer with much larger contact pad pitch, thereby resolving chip I/O pad crowding problem and improving the production yield and reliability of the semiconductor package.

Yet another objective of the present invention is to provide a semiconductor package for package-on-package stacking in which a base carrier is used to serve as a platform for chip-on-interposer attachment with the chip inserted in a through opening of the base carrier and the interposer located against the base carrier and beyond the through opening so as to provide adequate mechanical support for the inserted chip before disposing buildup circuitry.

In accordance with the foregoing and other objectives, the present invention proposes a semiconductor package with package-on-package stacking capability that includes a semiconductor device, an interposer, an adhesive, a base carrier, a first buildup circuitry, a second buildup circuitry and plated through holes. The interposer, interconnected to the semiconductor device by bumps, provides primary fan-out routing for the semiconductor device so that the possible bond pad disconnection induced by tight I/O pad pitch can be avoided. The base carrier, having a through opening, provides a platform for attaching the interposer thereon by the adhesive with the semiconductor device positioned in the through opening. The first and second buildup circuitries, disposed at opposite sides of the package, provide secondary fan-out routing and are electrically connected to each other through the plated through holes to provide the package with stacking capability. Another semiconductor package may be mounted on the top or the bottom buildup circuitry of the package to form a package-on-package assembly.

In another aspect, the present invention provides a method of making a semiconductor package with package-on-package stacking capability, including the steps of: providing a semiconductor device; providing an interposer that includes a first surface, a second surface opposite to the first surface, first contact pads on the first surface, second contact pads on the second surface, and through vias that electrically couple the first contact pads and the second contact pads; electrically coupling the semiconductor device to the second contact pads of the interposer by a plurality of bumps to form a chip-on-interposer subassembly; providing a base carrier having a first surface, an opposite second surface, and a through opening that extends through the base carrier between the first surface and the second surface thereof; attaching the chip-on-interposer subassembly to the base carrier using an adhesive with the semiconductor device inserted into the through opening and the interposer laterally extending beyond the through opening; with the chip-on-interposer subassembly attached to the base carrier, forming a first buildup circuitry on the first surface of the interposer and the first surface of the base carrier, wherein the first buildup circuitry is electrically coupled to the first contact pads of the interposer through first conductive vias of the first buildup circuitry; forming a second buildup circuitry on the semiconductor device and the second surface of the base carrier; and forming plated through holes that extend through the base carrier to provide electrical and thermal connections between the first buildup circuitry and the second buildup circuitry.

Unless specific descriptions or steps necessarily occur in a certain order, the sequence of the above-mentioned steps is not limited to that set forth above and may be changed or reordered according to desired design.

In yet another aspect, the present invention provides a semiconductor package with package-on-package stacking capability that includes a semiconductor device, an interposer, a base carrier, a first buildup circuitry, a second buildup circuitry and plated through holes, wherein (i) the interposer has a first surface, a second surface opposite to the first surface, first contact pads on the first surface, second contact pads on the second surface, and through vias that electrically couple the first contact pads and the second contact pads; (ii) the semiconductor device is electrically coupled to the second contact pads of the interposer by a plurality of bumps to form a chip-on-interposer subassembly; (iii) the base carrier has a first surface, an opposite second surface, and a through opening that extends through the base carrier between the first surface and the second surface thereof; (iv) the chip-on-interposer subassembly is attached to the base carrier using an adhesive with the semiconductor device inserted into the through opening and the interposer laterally extending beyond the through opening; (v) the first buildup circuitry is formed on the first surface of the interposer and the first surface of the base carrier and is electrically coupled to the first contact pads of the interposer through first conductive vias of the first buildup circuitry; (vi) the second buildup circuitry is formed on the semiconductor device and the second surface of the base carrier; and (vii) the plated through holes extend through the base carrier for providing electrical and thermal connections between the first buildup circuitry and the second buildup circuitry.

The method of making a semiconductor package for package-on-package stacking applications according to the present invention has numerous advantages. For instance, forming the chip-on-interposer subassembly before attaching it to the base carrier can ensure the semiconductor device is electrically connected so that any contact pad disconnection problem inherent to micro-via process can be avoided. Inserting the semiconductor device to the through opening by the chip-on-interposer subassembly is particularly advantageous as the shape of the through opening would not be a critical parameter that needs to be tightly controlled. Additionally, the two-step forming of the interconnect substrate for the semiconductor device is beneficial as the interposer can provide primary fan-out routing whereas the buildup circuitry provide further fan-out routing and horizontal interconnections between the upper and the lower packages.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENT

Hereafter, examples will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-17 are schematic views showing a method of making a semiconductor package for package-on-package stacking, that includes an interposer, semiconductor devices, a base carrier, dual buildup circuitries and plated through holes in accordance with an embodiment of the present invention.

Figure 17:
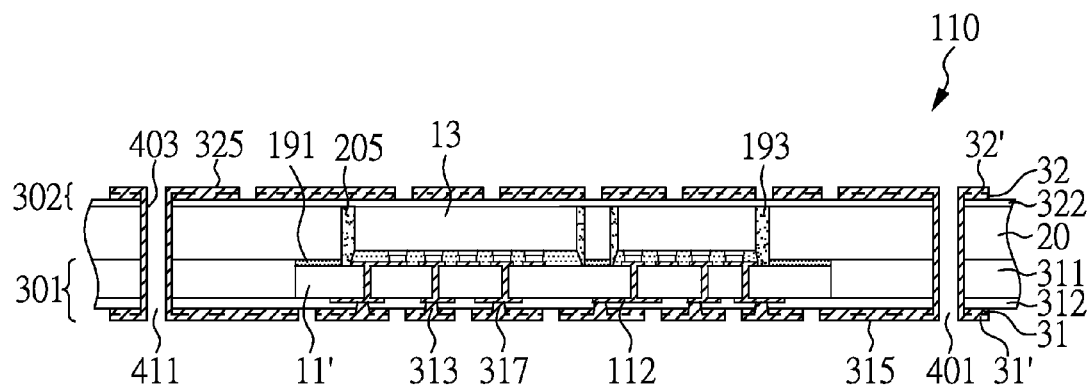
FIG. 17 is a cross-sectional view showing a state in which the structure of FIG. 16 is provided with conductive traces and plated through holes to finish the fabrication of a semiconductor package in accordance with the first embodiment of the present invention.

As shown in FIG. 17, the semiconductor package 110 for package-on-package stacking application includes an interposer 11', semiconductor devices 13, a base carrier 20, a first buildup circuitry 301, a second buildup circuitry 302 and plated through holes 411. The interposer 11' and the semiconductor devices 13 are attached to the base carrier 20 using an adhesive 191, with the semiconductor devices 13 positioned in through openings 205 of the base carrier 20. The first buildup circuitry 301 covers the interposer 11' and the base carrier 20 from the lower side and is electrically coupled to first contact pads 112 of the interposer 11' through first conductive vias 317, whereas the second buildup circuitry 302 covers the semiconductor devices 13 and the base carrier 20 from the upper side. The plated through holes 411 extend through the base carrier 20 and provide electrical and thermal connections between the first buildup circuitry 301 and the second buildup circuitry 302.

FIGS. 1, 3, 4, 6 and 8 are cross-sectional views showing a process of fabricating chip-on-interposer subassemblies in accordance with an embodiment of the present invention, and FIGS. 2, 5, 7 and 9 are top perspective views corresponding to FIGS. 1, 4, 6 and 8, respectively.

Figure 1:
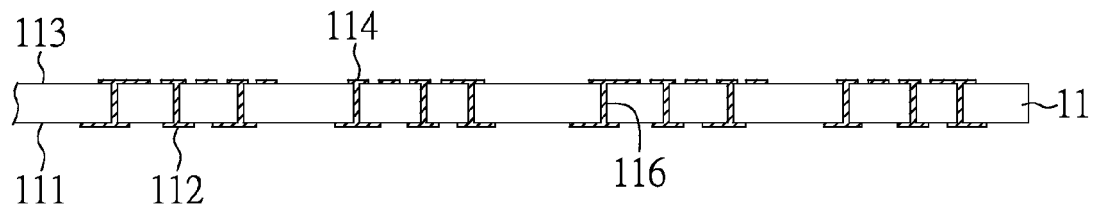
FIGS. 1 and 2 are cross-sectional and top perspective views, respectively, of an interposer panel in accordance with the first embodiment of the present invention.
Figure 2:
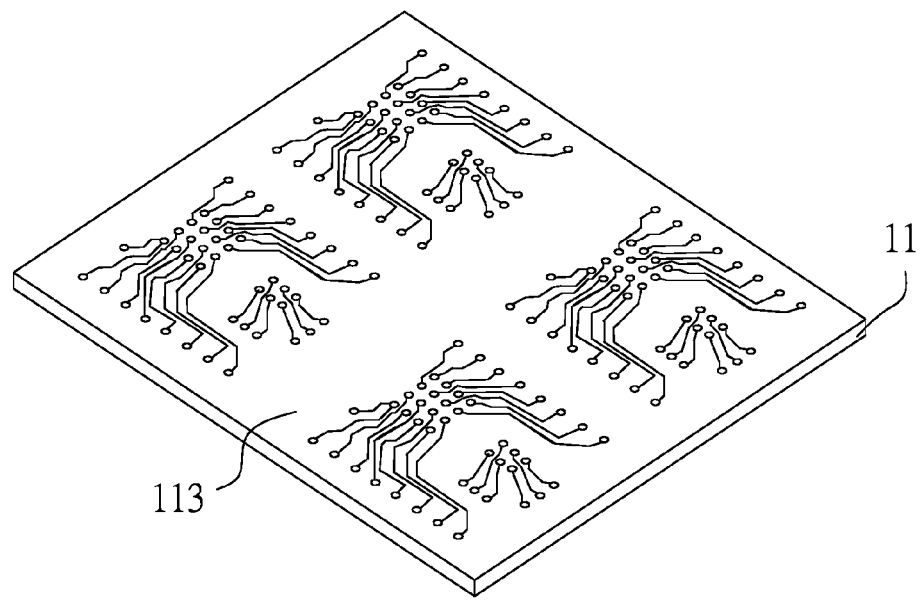

FIGS. 1 and 2 are cross-sectional and top perspective views, respectively, of an interposer panel 11, which includes a first surface 111, a second surface 113 opposite to the first surface 111, first contact pads 112 on the first surface 111, second contact pads 114 on the second surface 113, and through vias 116 that electrically couple the first contact pads 112 and the second contact pads 114. The interposer panel 11 can be a silicon, glass, ceramic, graphite or resin interposer that contains a pattern of traces that fan out from a finer pitch at the second contact pads 114 to a coarser pitch at the first contact pads 112.

Figure 3:
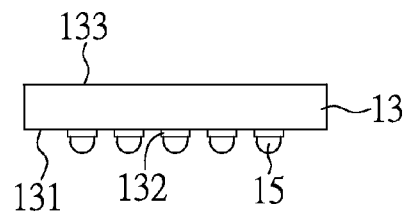
FIG. 3 is a cross-sectional view of a chip with bumps mounted thereon in accordance with the first embodiment of the present invention.

FIG. 3 is a cross-sectional view of a semiconductor device 13 with bumps 15 mounted thereon. In this embodiment, the semiconductor device 13 is a chip and includes an active surface 131, an inactive surface 133 opposite to the active surface 131, and I/O pads 132 on the active surface 131. The bumps 15 are mounted on the I/O pads 132 of the semiconductor device 13 and may be solder, gold or copper pillars.

Figure 4:
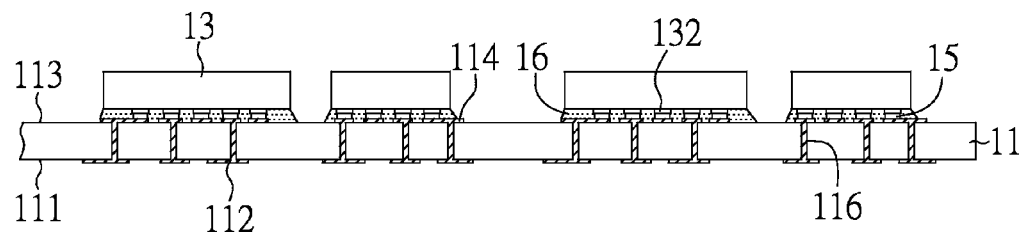
FIGS. 4 and 5 are cross-sectional and top perspective views, respectively, of a panel-scale assembly with the chips of FIG. 3 electrically coupled to the interposer panel of FIGS. 1 and 2 in accordance with the first embodiment of the present invention.
Figure 5:
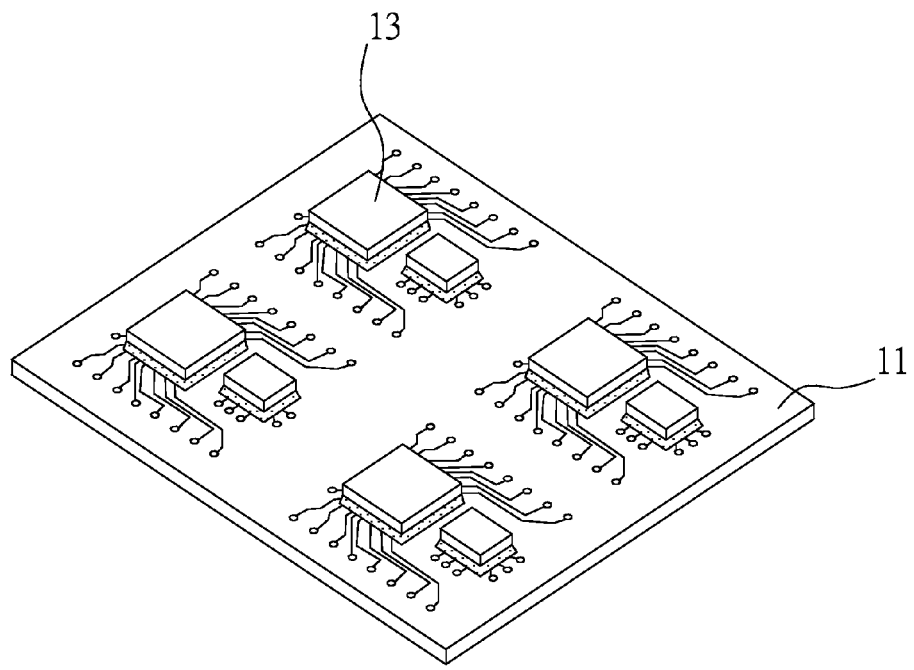

FIGS. 4 and 5 are cross-sectional and top perspective views, respectively, of the panel-scale assembly with the semiconductor devices 13 electrically coupled to the interposer panel 11. The semiconductor devices 13 can be electrically coupled to the second contact pads 114 of the interposer panel 11 using the bumps 15 by thermal compression, solder reflow or thermosonic bonding. As an alternative, the bumps 15 may be first deposited on the second contact pads 114 of the interposer panel 11, and then the semiconductor devices 13 are electrically coupled to the interposer panel 11 by the bumps 15. Optionally, underfill 16 can be further provided to fill the gap between the interposer panel 11 and the semiconductor devices 13.

Figure 6:
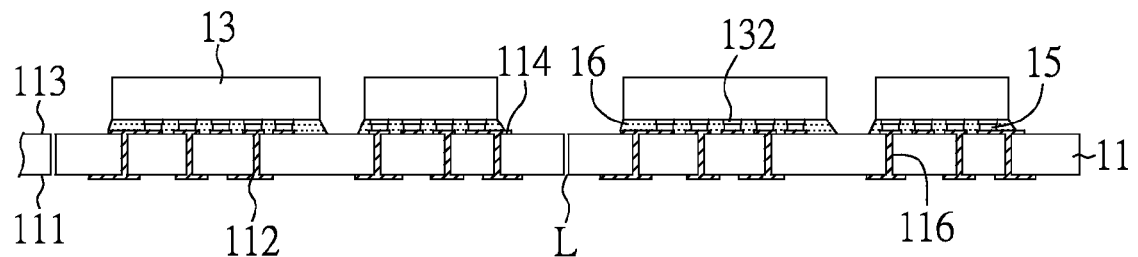
FIGS. 6 and 7 are cross-sectional and top perspective views, respectively, of a diced state of the panel-scale assembly of FIGS. 4 and 5 in accordance with the first embodiment of the present invention.
Figure 7:
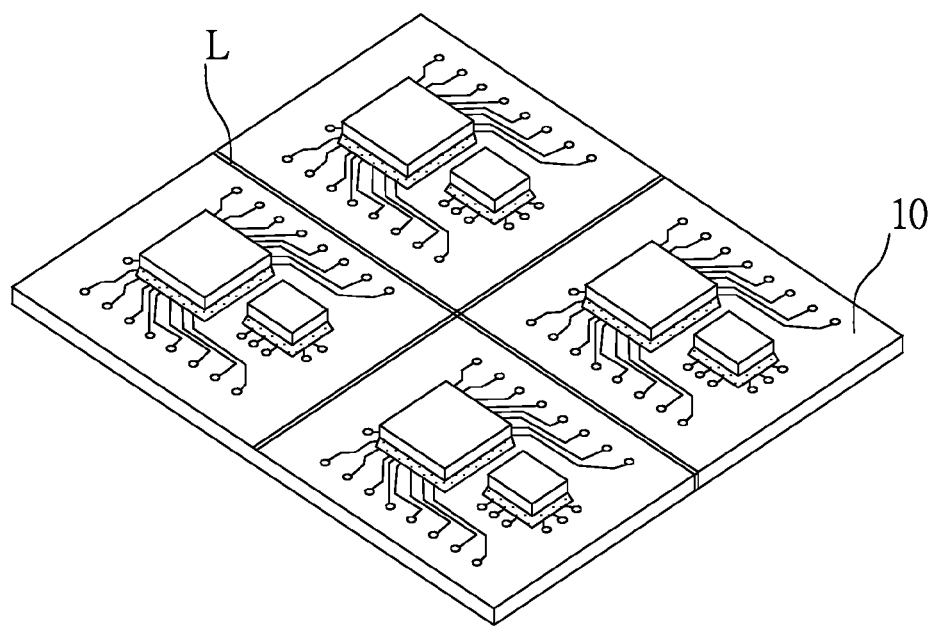

FIGS. 6 and 7 are cross-sectional and top perspective views, respectively, of the panel-scale assembly diced into individual pieces. The panel-scale assembly is singulated into individual chip-on-interposer subassembly 10 along dicing lines "L".

Figure 8:
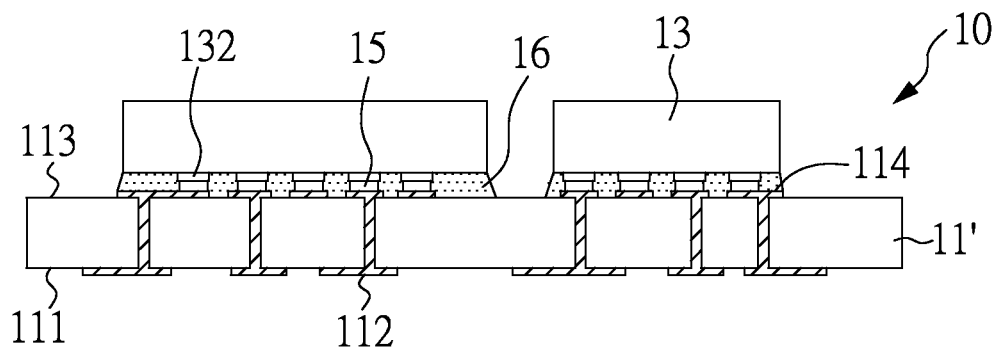
FIGS. 8 and 9 are cross-sectional and top perspective views, respectively, of a chip-on-interposer subassembly corresponding to a diced unit in FIGS. 6 and 7 in accordance with the first embodiment of the present invention.
Figure 9:
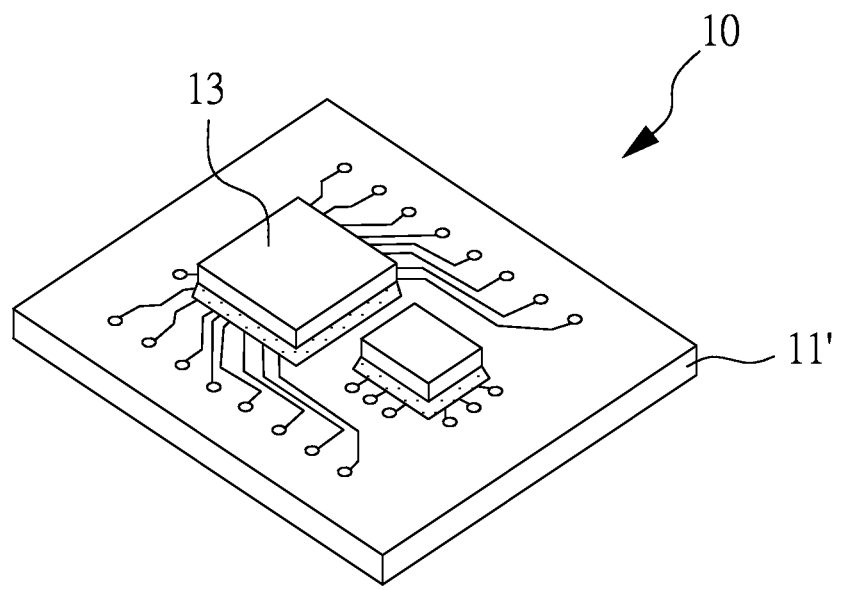

FIGS. 8 and 9 are cross-sectional and top perspective views, respectively, of the individual chip-on-interposer subassembly 10. In this illustration, the chip-on-interposer subassembly 10 includes two semiconductor devices 13 electrically coupled on the diced interposer 11'. As the size and pad spacing of the first contact pads 112 of the interposer 11' are designed to be larger than those of the chip I/O pads 132, the interposer 11' can provide a primary fan-out routing for the semiconductor devices 13 so as to ensure a higher manufacturing yield for the next level buildup circuitry interconnection. Furthermore, the interposer 11' also provides primary electrical connections between adjoining semiconductor devices 13 prior to interconnecting to the next level interconnection structure.

Figure 10:
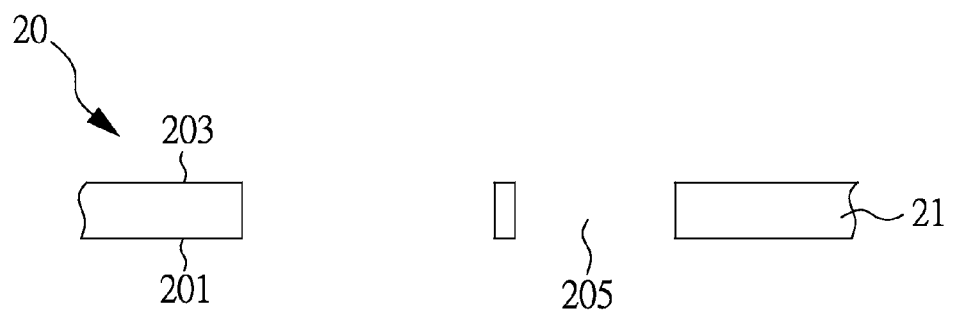
FIGS. 10 and 11 are cross-sectional and bottom perspective views, respectively, of a base carrier in accordance with the first embodiment of the present invention.
Figure 11:
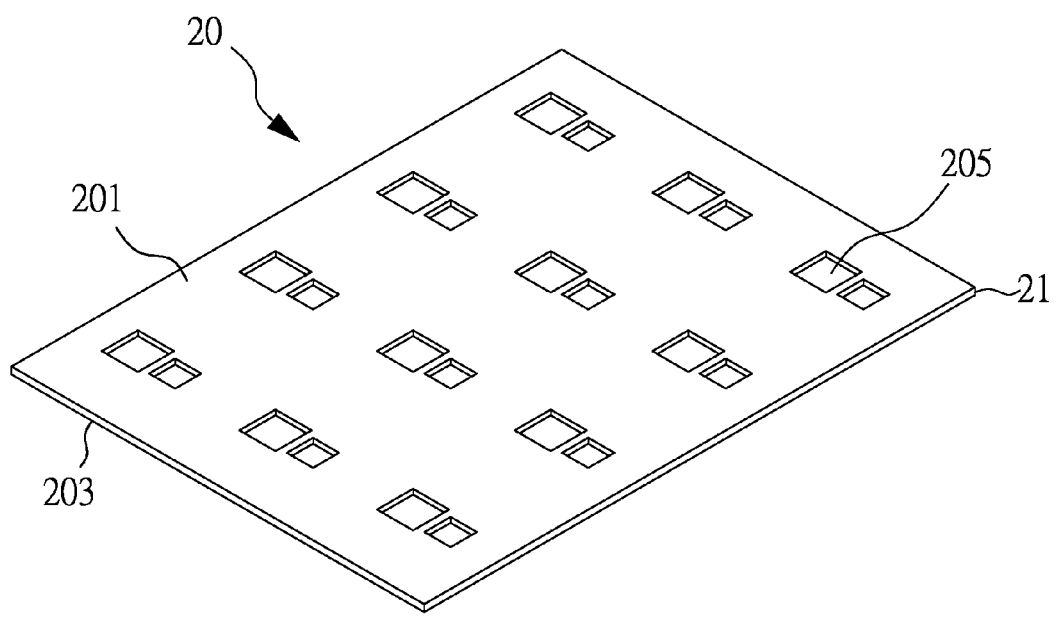

FIGS. 10 and 11 are cross-sectional and bottom perspective views, respectively, of a base carrier 20 with a first surface 201, an opposite second surface 203, and through openings 205 that extend through the base carrier 20 between the first surface 201 and the second surface 203 in the vertical direction. The base carrier 20 can be provided by forming the through openings 205 in a dielectric layer 21. The dielectric layer 21 can have a thickness of 0.1 mm to 1 mm, and is typically made of epoxy resin, glass-epoxy, polyimide or the like. Also, the base carrier 20 may be made of other non-metallic materials, such as ceramics, aluminum oxide ($Al_2O_3$), aluminum nitride (AlN), silicon nitride (SiN), silicon (Si) or glass. In this embodiment, the dielectric layer 21 has a thickness of 0.15 mm which is close to the combined thickness of the 0.1 mm chip and the 0.05 mm conductive bumps. The through openings 205 can be formed by laser cutting, punching or mechanical drilling, and each of them can have a different size. In this embodiment, the through openings 205 each have a dimension that is essentially the same or slightly larger than the subsequently disposed semiconductor device.

Figure 12:
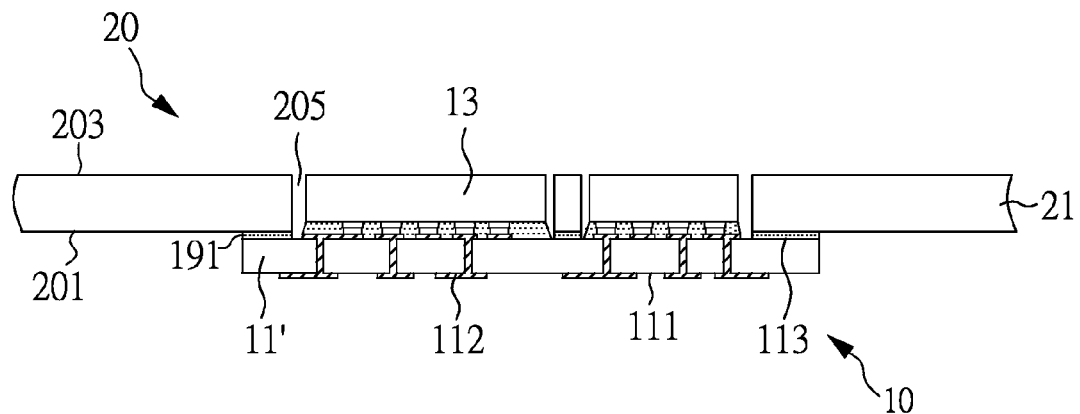
FIGS. 12 and 13 are cross-sectional and bottom perspective views, respectively, showing a state in which the chip-on-interposer subassemblies of FIGS. 8 and 9 are attached to the base carrier of FIGS. 10 and 11 in accordance with the first embodiment of the present invention.
Figure 13:
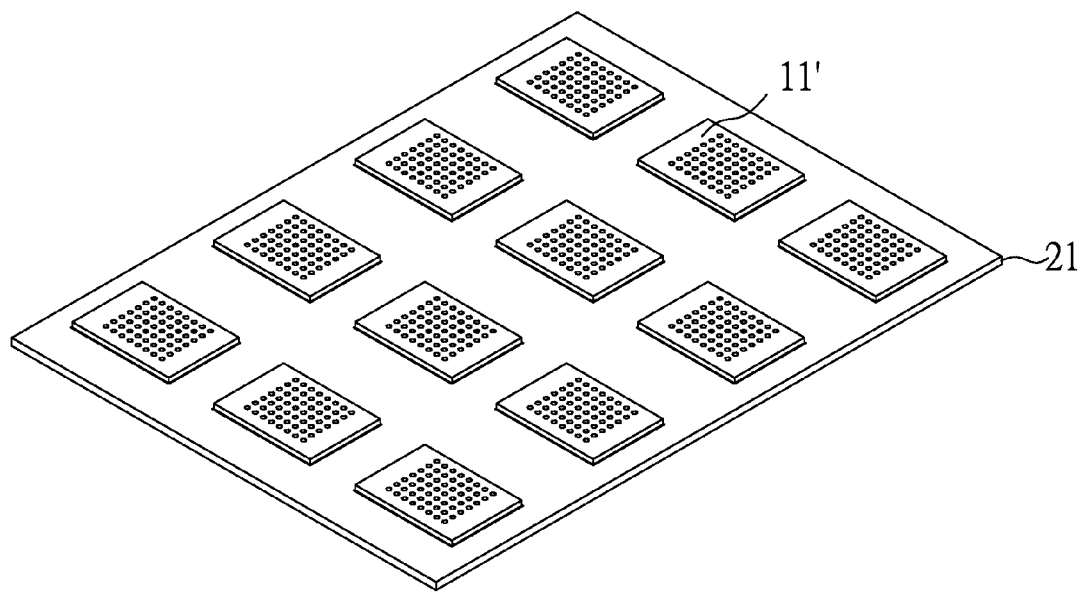

FIGS. 12 and 13 are cross-sectional and bottom perspective views, respectively, of the structure of the chip-on-interposer subassemblies 10 attached to the base carrier 20 using an adhesive 191 that is disposed between and contacts the first surface 201 of the base carrier 20 and the second surface 113 of the interposer 11'. The semiconductor devices 13 are inserted into the through openings 205, and the interposers 11' are located beyond the through openings 205 and spaced from the peripheral edges of the base carrier 20.

Figure 14:
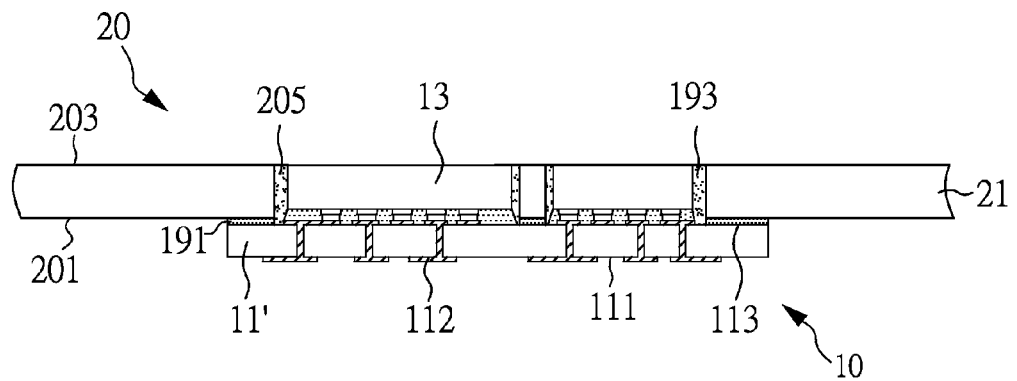
FIG. 14 is a cross-sectional view showing a state in which the structure of FIG. 12 is provided with a filler material in accordance with the first embodiment of the present invention.

FIG. 14 is a cross-sectional view of the structure provided with a filler material 193. The filler material 193 is dispensed in the remaining space of the through openings 205 and surrounds the semiconductor devices 13 and is essentially coplanar with the semiconductor devices 13 and the base carrier 20 in the upward direction.

Figure 15:
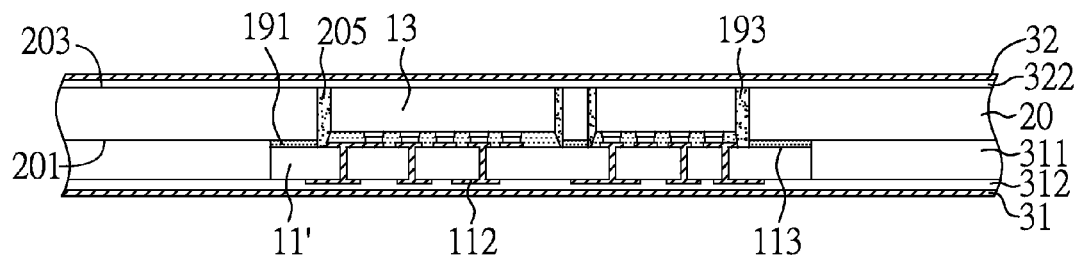
FIG. 15 is a cross-sectional view showing a state in which laminated layers are disposed on the structure of FIG. 14 in accordance with the first embodiment of the present invention.

FIG. 15 is a cross-sectional view of the structure with a balancing layer 311, a first insulating layer 312 and a first metal sheet 31 laminated/coated on the interposers 11' and the base carrier 20 from below, and a second insulating layer 322 and a second metal sheet 32 laminated/coated on the semiconductor devices 13 and the base carrier 20 from above. The balancing layer 311 contacts and extends from the first surface 201 of the base carrier 20 in the downward direction and laterally covers and surrounds and conformally coats the sidewalls of the interposers 11' and extends laterally from the interposers 11' to the peripheral edges of the structure. The first insulating layer 312 contacts and covers and extends laterally on the first surface 111 of the interposers 11' and the balancing layer 311 in the downward direction. The second insulating layer 322 contacts and covers and extends laterally on the semiconductor devices 13, the filler material 193 and the second surface 203 of the base carrier 20 in the upward direction. The first metal sheet 31 contacts and covers the first insulating layer 312 from below, and the second metal sheet 32 contacts and covers the second insulating layer 322 from above. In this embodiment, the balancing layer 311 has a thickness of 0.2 mm which is close to the thickness of the interposer 11', and the first and second insulating layers 312, 322 each typically have a thickness of 50 microns. The balancing layer 311 and the first and second insulating layers 312, 322 can be made of epoxy resin, glass-epoxy, polyimide, and the like. The first and second metal sheets 31, 32 in this embodiment each are a copper layer with a thickness of 25 microns.

Figure 16:
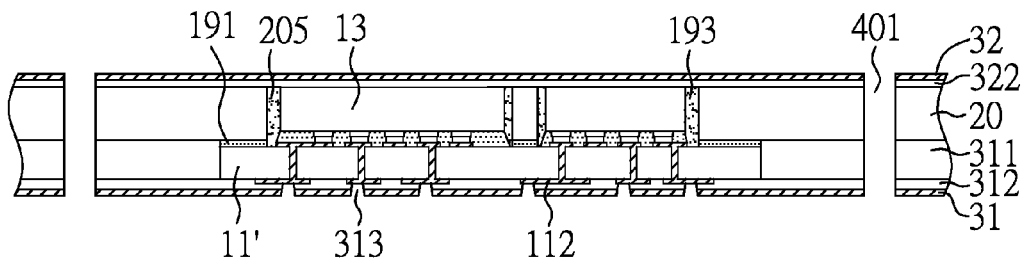
FIG. 16 is a cross-sectional view showing a state in which the structure of FIG. 15 is provided with via openings and through holes in accordance with the first embodiment of the present invention.

FIG. 16 is a cross-sectional view of the structure provided with first via openings 313 and through holes 401. The first via openings 313 extend through the first metal sheet 31 and the first insulating layer 312 and are aligned with the first contact pads 112 of the interposer 11'. The through holes 401 extend through the first metal sheet 31, the first insulating layer 312, the balancing layer 311, the base carrier 20, the second insulating layer 322 and the second metal sheet 32 in the vertical direction. The first via openings 313 may be formed by numerous techniques including laser drilling, plasma etching and photolithography, and typically have a diameter of 50 microns. Laser drilling can be enhanced by a pulsed laser. Alternatively, a scanning laser beam with a metal mask can be used. For instance, copper can be etched first to create a metal window followed by laser. The through holes 401 are formed by mechanical drilling and can be formed by other techniques such as laser drilling and plasma etching with or without wet etching.

Referring now to FIG. 17, first conductive traces 315 and second conductive traces 325 are respectively formed on the first insulating layer 312 and the second insulating layer 322 by depositing a first plated layer 31' on the first metal sheet 31 and into the first via openings 313, depositing a second plated layer 32' on the second metal sheet 32, and then patterning the first and second metal sheets 31, 32 as well as the first and second plated layers 31', 32' thereon. Alternatively, when no first and second metal sheets 31, 32 are laminated on the first and second insulating layers 312, 322 in the previous process, the first and second insulating layers 312, 322 can be directly metallized to form the first and second conductive traces 315, 325. The first conductive traces 315 extend from the first contact pads 112 of the interposer 11' in the downward direction, fill up the first via openings 313 to form first conductive vias 317 in direct contact with the first contact pads 112 of the interposer 11', and extend laterally on the first insulating layer 312. The second conductive traces 325 extend from the second insulating layer 322 in the upward direction and extend laterally on the second insulating layer 322. As a result, the first conductive traces 315 can provide horizontal signal routing in both the X and Y directions and vertical routing through the first via openings 313 and serve as electrical connections for the interposer 11'.

Also shown in FIG. 17 is a connecting layer 403 deposited in the through holes 401 to provide the plated through holes 411. The connecting layer 403 is a hollow tube that covers the inner sidewall of the through holes 401 and extends vertically to electrically connect the first conductive traces 315 and the second conductive traces 325. Alternatively, the connecting layer 403 can fill the through holes 401. In this case, the plated through hole 411 becomes a metal post and there is no space for an insulative filler in the through holes 401.

The first and second plated layer 31', 32' and the connecting layer 403 can be deposited by any of numerous techniques including electroplating, electroless plating, evaporating, sputtering, and their combinations, as a single layer or multiple layers. For instance, they can be deposited by first dipping the structure in an activator solution to render the first and second insulating layers 312, 322 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the first and second conductive traces 315, 325 by any of numerous techniques including wet etching, electro-chemical etching, laser-assist etching, and their combinations, with an etch masks (not shown) thereon that define the first and second conductive traces 315, 325. Preferably, the first and second plated layer 31', 32' and the connecting layer 403 are formed of the same material deposited simultaneously in the same manner and have the same thickness.

The first and second metal sheets 31, 32, the first and second plated layers 31', 32' and the connecting layer 403 are shown as a single layer for convenience of illustration. The boundary (shown in broken lines) between the metal layers may be difficult or impossible to detect since copper is plated on copper.

Accordingly, as shown in FIG. 17, a semiconductor package 110 is accomplished and includes an interposer 11', semiconductor devices 13, a base carrier 20, a first buildup circuitry 301, a second buildup circuitry 302, and plated through holes 411. In this illustration, the first buildup circuitry 301 includes a balancing layer 311, a first insulating layer 312 and first conductive traces 315; and the second buildup circuitry 302 includes a second insulating layer 322 and second conductive traces 325. The semiconductor devices 13 are electrically coupled to the pre-fabricated interposer 11' by flip chip process to form a chip-on-interposer subassembly 10. The chip-on-interposer subassembly 10 is attached to the base carrier 20 using an adhesive 191 with the semiconductor devices 13 positioned within the through openings 205 and the interposer 11' laterally extending beyond the through openings 205. The first buildup circuitry 301 is electrically coupled to the interposer 11' through the first conductive vias 317 in direct contact with the first contact pads 112 of the interposer 11', and thus the electrical connection between the interposer 11' and the first buildup circuitry 301 is devoid of soldering material. The second buildup circuitry 302 is electrically connected to the first buildup circuitry 301 by the plated through holes 411. The plated through holes 411 are essentially shared by the base carrier 20, the first buildup circuitry 301 and the second buildup circuitry 302, and provide electrical and thermal connections between the first buildup circuitry 301 and the second buildup circuitry 302.

Figure 18:
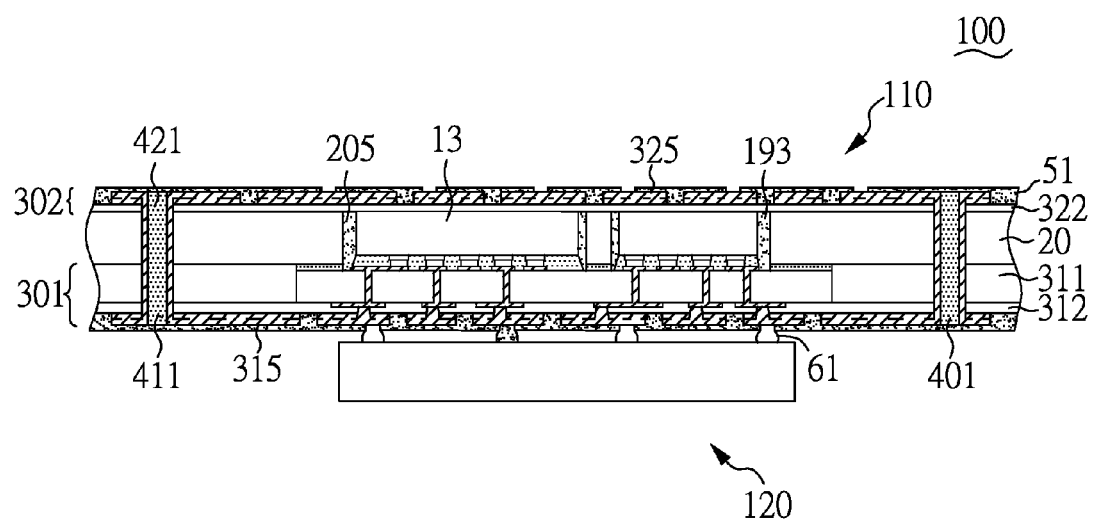
FIG. 18 is a cross-sectional view showing a package-on-package assembly with another semiconductor package mounted on the semiconductor package of FIG. 17 in accordance with the first embodiment of the present invention.

FIG. 18 is a cross-sectional view of a package-on-package assembly 100 with another semiconductor package 120 mounted on the first buildup circuitry 301 of the semiconductor package 110 illustrated in FIG. 17. The semiconductor package 120 can be any type of package. For instance, the semiconductor package 120 may be a conventional IC package or anyone package conceived by the present invention. In this illustration, the semiconductor package 110 is further provided with an insulative filler 421 in the remaining space of the through holes 401 and solder mask material 51 on the first and second buildup circuitries 301, 302. The solder mask material 51 includes solder mask openings to expose selected portions of the first and second conductive traces 315, 325. Accordingly, the semiconductor package 120 is mounted on the exposed portions of the first conductive traces 315 of the semiconductor package 110 via solder balls 61.

Embodiment 2

FIGS. 19-27 are schematic views showing a method of making another semiconductor package with package-on-package stacking capability which has a registration mark for interposer attachment and horizontal and vertical EMI (electromagnetic interference) shields for the semiconductor devices in accordance with another embodiment of the present invention.

For purposes of brevity, any description in Embodiment 1 above is incorporated herein insofar as the same is applicable, and the same description need not be repeated.

Figure 19:
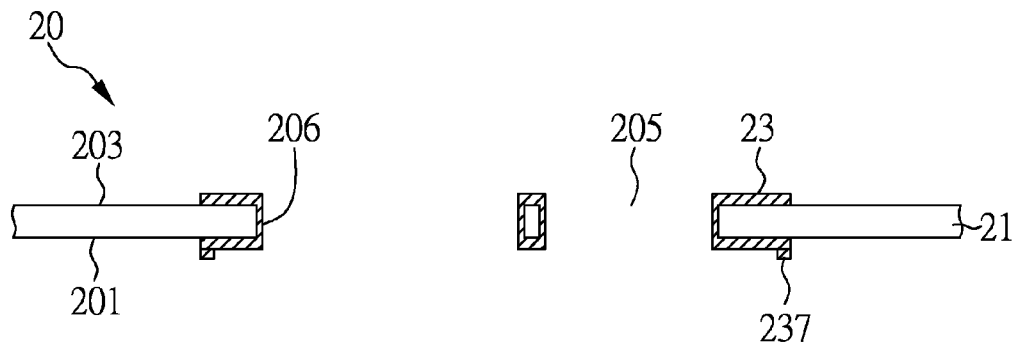
FIGS. 19 and 20 are cross-sectional and bottom perspective views, respectively, showing a base carrier in accordance with the second embodiment of the present invention.
Figure 20:
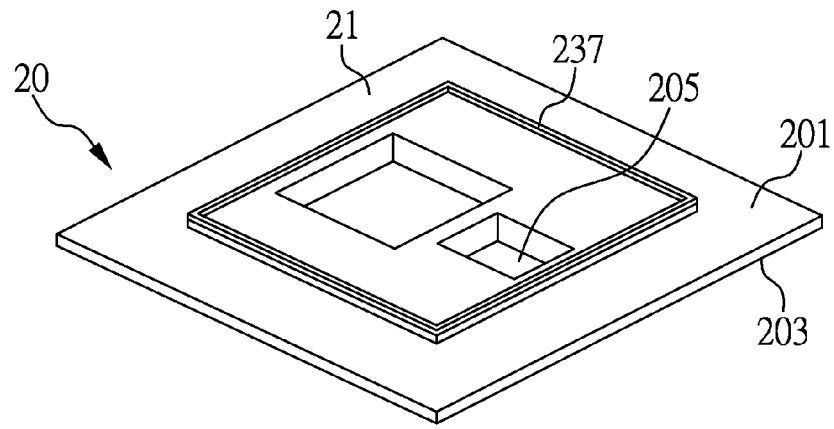

FIGS. 19 and 20 are cross-sectional and bottom perspective views, respectively, of a base carrier 20 having through openings 205 and a registration mark 237. The through openings 205 extend through the base carrier 20 between the first surface 201 and the second surface 203 thereof, and the registration mark 237 is formed on the first surface 201. In this embodiment, the base carrier 20 includes a conductive layer 23 (typically a copper layer) on the sidewalls of the through openings 205 as well as the opposite surfaces of a dielectric layer 21 having a thickness of about 0.15 mm. As such, the through openings 205 have shielding sidewalls 206 and can provide lateral EMI shielding effect for subsequently disposed semiconductor devices within the through openings 205. The registration mark 237 can be formed on the lower part of the conductive layer 23 by pattern deposition, including electroplating, electroless plating, evaporating, sputtering and their combinations using photolithographic process. Accordingly, the registration mark 237 extends from the lower part of the conductive layer 23 of the base carrier 20 in the downward direction and can have a thickness of 5 to 200 microns. As shown in FIG. 20, the registration mark 237 is spaced from the peripheral edges of the base carrier 20 and consists of a continuous metal strip arranged in a rectangular frame configuration conforming to four lateral sides of a subsequently disposed interposer.

Figure 21:
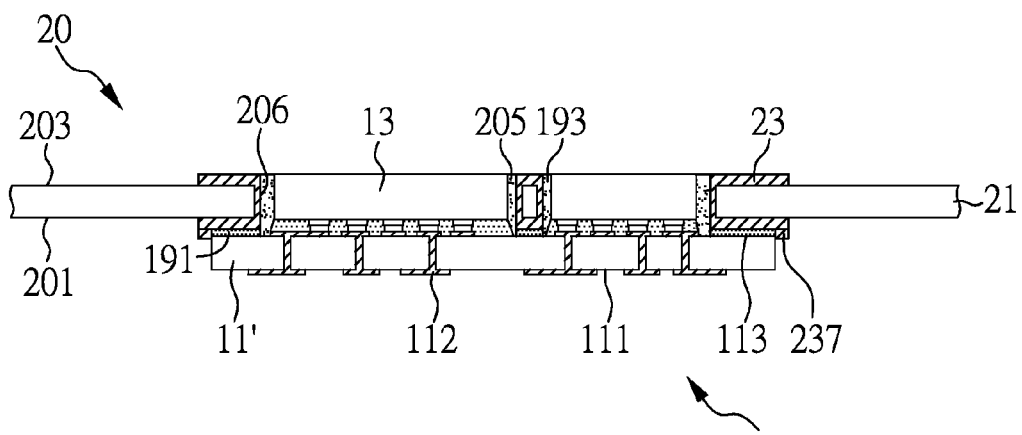
FIG. 21 is a cross-sectional view showing a state in which the chip-on-interposer subassembly of FIG. 8 is attached to the base carrier of FIG. 19 in accordance with the second embodiment of the present invention.

FIG. 21 is a cross-sectional view of the structure with the chip-on-interposer subassembly 10 of FIG. 8 attached to the base carrier 20 using an adhesive 191. The interposer 11' and the semiconductor devices 13 are attached to the base carrier 20 with the semiconductor devices 13 inserted into the through openings 205 and the registration mark 237 laterally aligned with and in close proximity to the peripheral edges of the interposer 11'. The interposer placement accuracy is provided by the registration mark 237. The registration mark 237 extends beyond the second surface 113 of the interposer 11' in the downward direction and is located beyond and laterally aligned with the four lateral surfaces of the interposer 11' in the lateral directions. As the registration mark 237 is in close proximity to and conforms to the four lateral surfaces of the interposer 11' in lateral directions, any undesirable movement of the chip-on-interposer subassembly 10 due to adhesive curing can be avoided. Preferably, a gap in between the interposer 11' and the registration mark 237 is in a range of about 5 to 50 microns. The chip-on-interposer subassembly 10 can also be attached without the registration mark 237. Although the through openings 205 cannot provide placement accuracy for the chip-on-interposer subassembly 10, it does not result in micro-via connection failure in the subsequent process of forming buildup circuitry on interposer 11' due to the larger pad size and pitch of the interposer 11'. Further, a filler material 193 is dispensed in the remaining space of the through openings 205 and surrounds the semiconductor devices 13 and is essentially coplanar with the semiconductor devices 13 and the base carrier 20 in the upward direction.

Figure 22:
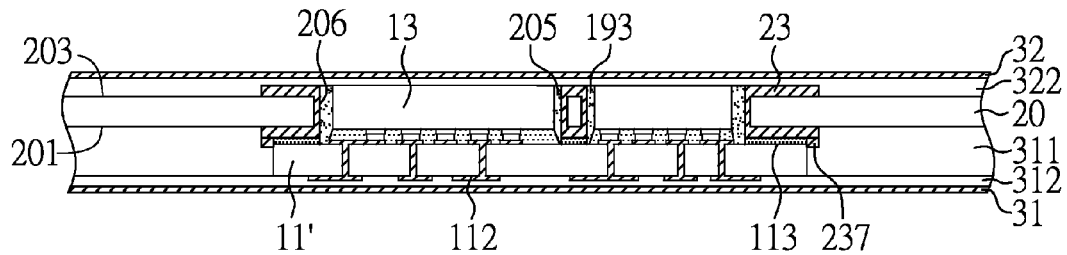
FIG. 22 is a cross-sectional view showing a state in which laminated layers are disposed on the structure of FIG. 21 in accordance with the second embodiment of the present invention.

FIG. 22 is a cross-sectional view of the structure with a balancing layer 311, a first insulating layer 312 and a first metal sheet 31 laminated/coated on the interposer 11' and the base carrier 20 from below, and a second insulating layer 322 and a second metal sheet 32 laminated/coated on the semiconductor devices 13 and the base carrier 20 from above. The balancing layer 311 contacts and extends from the first surface 201 of the base carrier 20 in the downward direction and laterally covers and surrounds and conformally coats the sidewalls of the interposer 11' and extends laterally from the interposer 11' to the peripheral edges of the structure. The first insulating layer 312 contacts and provides robust mechanical bonds between the first metal sheet 31 and the interposer 11' and between the first metal sheet 31 and the balancing layer 311. The second insulating layer 322 contacts and covers and extends laterally on the semiconductor devices 13, the filler material 193 and the second surface 203 of the base carrier 20 in the upward direction. The second metal sheet 32 contacts and covers the second insulating layer 322 in the upward direction.

Figure 23:
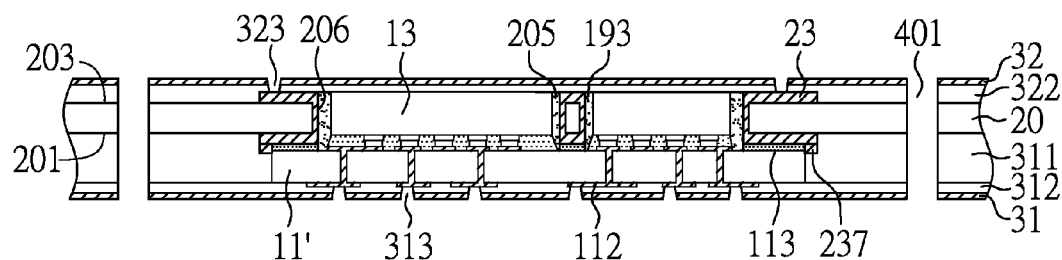
FIG. 23 is a cross-sectional view showing a state in which the structure of FIG. 22 is provided with via openings and through holes in accordance with the second embodiment of the present invention.

FIG. 23 is a cross-sectional view of the structure provided with first via openings 313, second via openings 323 and through holes 401. The first via openings 313 extend through the first metal sheet 31 and the first insulating layer 312 and are aligned with the first contact pads 112 of the interposer 11'. The second via openings 323 extend through the second metal sheet 32 and the second insulating layer 322 and are aligned with the upper part of the conductive layer 23 of the base carrier 20. The through holes 401 extend though the first metal sheet 31, the first insulating layer 312, the balancing layer 311, the base carrier 20, the second insulating layer 322 and the second metal sheet 32 in vertical direction.

Figure 24:
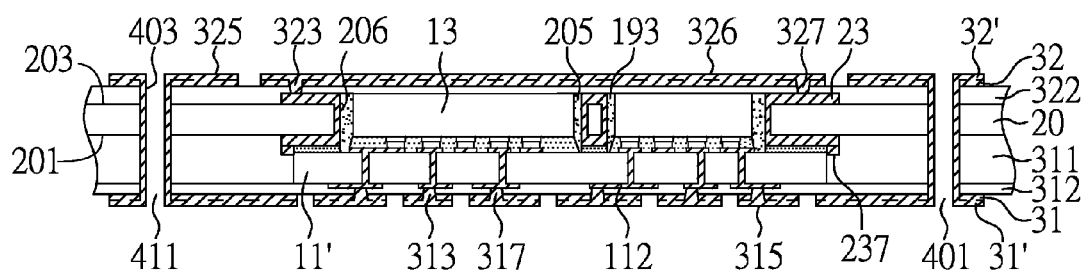
FIG. 24 is a cross-sectional view showing a state in which the structure of FIG. 23 is provided with conductive traces and plated through holes in accordance with the second embodiment of the present invention.

Referring now to FIG. 24, a first plated layer 31' and a second plated layer 32' are respectively deposited on the first metal sheet 31 and the second metal sheet 32 and into the first and second via openings 313, 323, followed by patterning the first and second metal sheets 31, 32 as well as the first and second plated layers 31', 32' thereon to form first conductive traces 315, second conductive traces 325 and a metal shield 326. Also, a connecting layer 403 is deposited in the through holes 401 to provide plated through holes 411. The first conductive traces 315 extend from the first contact pads 112 of the interposer 11' in the downward direction, fill up the first via openings 313 to form first conductive vias 317 in direct contact with the first contact pads 112 of the interposer 11', and extend laterally on the first insulating layer 312, thereby providing signal routings for the interposer 11'. The second conductive traces 325 extend from the second insulating layer 322 in the upward direction and extend laterally on the second insulating layer 322. The metal shield 326 extends from the upper part of the conductive layer 23 in the upward direction, extends laterally on the second insulating layer 322 to fill up the second via openings 323, and is therefore electrically connected to the base carrier 20 through second conductive vias 327. The plated through holes 411 at the first end extend to the first conductive traces 315 and at the second end extend to the second conductive traces 325 to provide a vertical electrical connection pathway.

Figure 25:
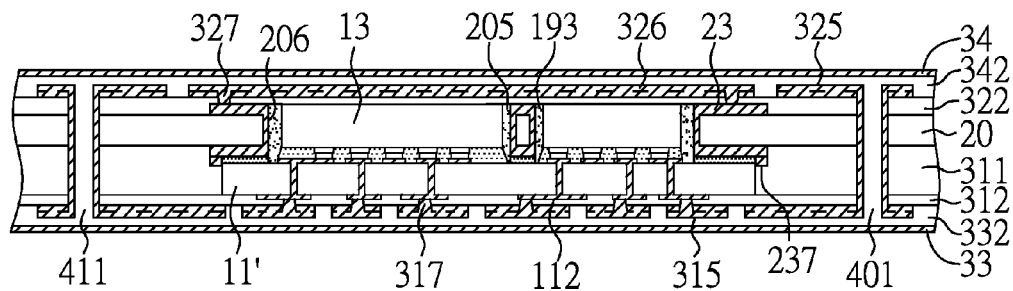
FIG. 25 is a cross-sectional view showing a state in which laminated layers are disposed on the structure of FIG. 24 in accordance with the second embodiment of the present invention.

FIG. 25 is a cross-sectional view of the structure with a third insulating layer 332 and a third metal sheet 33 laminated/coated on the first insulating layer 312 and the first conductive traces 315 from below, and a fourth insulating layer 342 and a fourth metal sheet 34 laminated/coated on the second insulating layer 322, the second conductive traces 325 and the metal shield 326 from above. The third insulating layer 332 is sandwiched between the first insulating layer 312/the first conductive traces 315 and the third metal sheet 33 and extends into the remaining space of the through holes 401. Likewise, the fourth insulating layer 342 is sandwiched between the second insulating layer 322/the second conductive traces 325/the metal shield 326 and the fourth metal sheet 34 and extends into the remaining space of the through holes 401. The third and fourth insulating layers 332, 342 can be formed of epoxy resin, glass-epoxy, polyimide and the like and typically has a thickness of 50 microns. The third and fourth metal sheets 33, 34 are respectively illustrated as a copper layer with a thickness of 25 microns.

Figure 26:
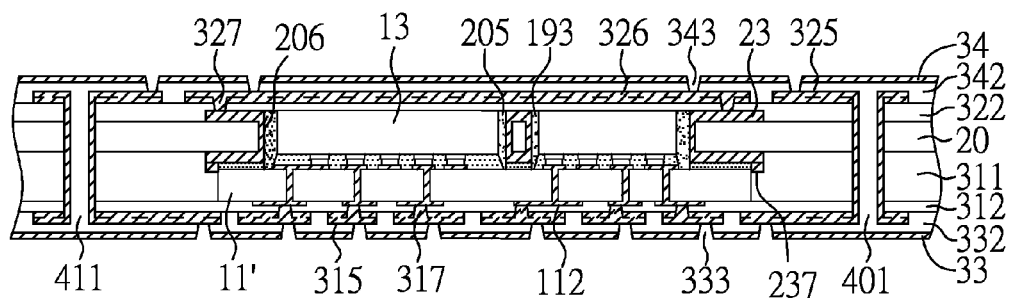
FIG. 26 is a cross-sectional view showing a state in which the structure of FIG. 25 is provided with via openings in accordance with the second embodiment of the present invention.

FIG. 26 is a cross-sectional view of the structure provided with the third and fourth via openings 333, 343 to expose selected portions of the first and second conductive traces 315, 325 and the metal shield 326. The third via openings 333 extend through the third metal sheet 33 and the third insulating layer 332, and are aligned with selected portions of the first conductive traces 315. The fourth via openings 343 extend through the fourth metal sheet 34 and the fourth insulating layer 342, and are aligned with selected portions of the second conductive traces 325 and the metal shield 326. Like the first and second via openings 313, 323, the third and fourth via openings 333, 343 can be formed by any of numerous techniques including laser drilling, plasma etching and photolithography and typically have a diameter of 50 microns.

Figure 27:
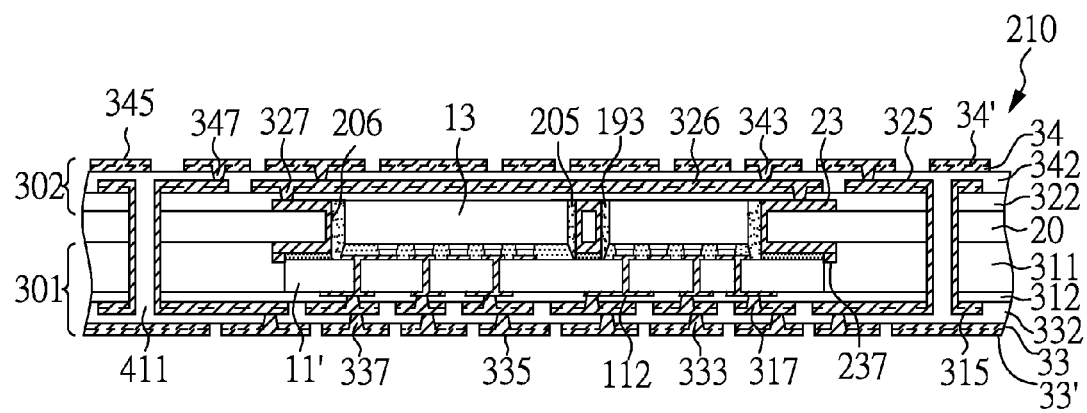
FIG. 27 is a cross-sectional view showing a state in which the structure of FIG. 26 is provided with conductive traces to finish the fabrication of a semiconductor package in accordance with the second embodiment of the present invention.

Referring now to FIG. 27, the third conductive traces 335 and fourth conductive traces 345 are respectively formed on the third insulating layer 332 and the fourth insulating layer 342 by depositing a third plated layer 33' on the third metal sheet 33 and into the third via openings 333, depositing a fourth plated layer 34' on the fourth metal sheet 34 and into the fourth via openings 343, and then patterning the third and fourth metal sheets 33, 34 as well as the third and fourth plated layers 33', 34' thereon. Alternatively, when no third and fourth metal sheets 33, 34 are laminated on the third and fourth insulating layers 332, 342 in the previous process, the third and fourth insulating layers 332, 342 can be directly metallized to form the third and fourth conductive traces 335, 345. The third conductive traces 335 extend from the first conductive traces 315 in the downward direction, fill up the third via openings 333 to form the third conductive vias 337 in direct contact with the first conductive traces 315, and extend laterally on the third insulating layer 332. The fourth conductive traces 345 extend from the second conductive traces 325 and the metal shield 326 in the upward direction, fill up the fourth via openings 343 to form the fourth conductive vias 347 in direct contact with the second conductive traces 325 and the metal shield 326, and extend laterally on the fourth insulating layer 342.

Accordingly, as shown in FIG. 27, a semiconductor package 210 is accomplished and includes an interposer 11', semiconductor devices 13, a base carrier 20, a first buildup circuitry 301, a second buildup circuitry 302, and plated through holes 411. In this illustration, the first buildup circuitry 301 includes a balancing layer 311, a first insulating layer 312, first conductive traces 315, a third insulating layer 332 and third conductive traces 335; and the second buildup circuitry 302 includes a second insulating layer 322, second conductive traces 325, a metal shield 326, a fourth insulating layer 342 and fourth conductive traces 345. The semiconductor devices 13 are electrically coupled to the pre-fabricated interposer 11' by flip chip process to form a chip-on-interposer subassembly 10. The chip-on-interposer subassembly 10 is attached to the base carrier 20 using an adhesive 191 with the semiconductor devices 13 positioned within the through openings 205 and the interposer 11' laterally extending beyond the through openings 205. The base carrier 20 has the registration mark 237 that extends beyond the second surface 113 of the interposer 11' in the downward direction and is in close proximity to the peripheral edges of the interposer 11' to provide critical placement accuracy for the interposer 11'. The through openings 205 of the base carrier 20 have the shielding sidewalls 206 that laterally enclose and completely cover the semiconductor devices 13 in the lateral directions. The metal shield 326 of the second buildup circuitry 302 laterally extends beyond the peripheral edges of the semiconductor devices 13 to completely cover the semiconductor devices 13 in the upward direction and is electrically connected to the shielding sidewalls 206 through the second conductive vias 327 in direct contact with the upper part of the conductive layer 23. The plated through holes 411 vertically extend to the first conductive traces 315 at the first end and to the second conductive traces 325 at the second end. As a result, the plated through holes 411 can provide the semiconductor package 210 with stacking capacity, and the shielding sidewalls 206 and the metal shield 326 can be electrically connected to ground contact pads of semiconductor devices 13 through the fourth conductive traces 345, the second conductive traces 325, the plated through holes 411 and the first conductive traces 315, thereby providing horizontal and vertical EMI shielding effect for the semiconductor devices 13.

Figure 28:
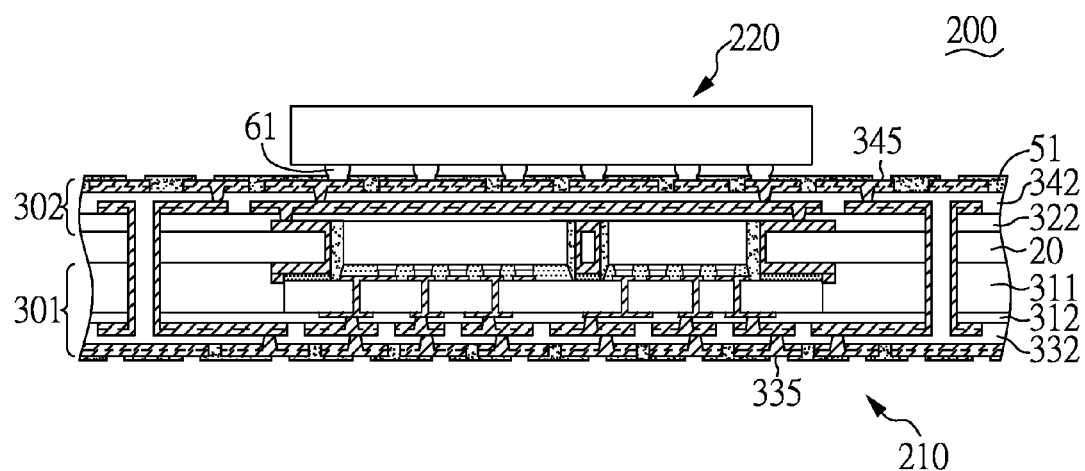
FIG. 28 is a cross-sectional view showing a package-on-package assembly with another semiconductor package mounted on the semiconductor package of FIG. 27 in accordance with the second embodiment of the present invention.

FIG. 28 is a cross-sectional view of a package-on-package assembly 200 with another semiconductor package 220 mounted on the second buildup circuitry 302 of the semiconductor package 210 illustrated in FIG. 27. In this illustration, the semiconductor package 210 is further provided with solder mask material 51 on the first and second buildup circuitries 301, 302. The solder mask material 51 includes solder mask openings to expose selected portions of the third conductive traces 335 and the fourth conductive traces 345. Accordingly, the semiconductor package 220 is mounted on the exposed portions of the fourth conductive traces 345 of the semiconductor package 210 via solder balls 61.

Embodiment 3

FIGS. 29-38 are schematic views showing a method of making yet another semiconductor package with package-on-package stacking capability in which the base carrier is fabricated from a laminate substrate in accordance with yet another embodiment of the present invention.

For purposes of brevity, any description in the aforementioned Embodiments is incorporated herein insofar as the same is applicable, and the same description need not be repeated.

Figure 29:
FIG. 29 is a cross-sectional view showing a laminate substrate in accordance with the third embodiment of the present invention.
Figure 30:
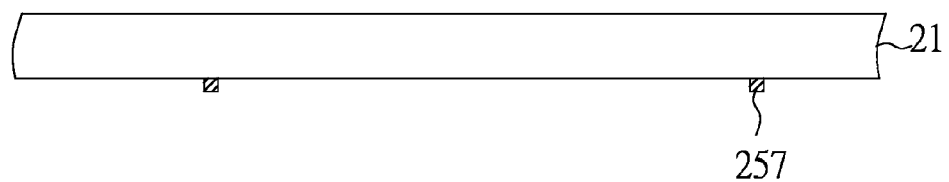
FIGS. 30 and 31 are cross-sectional and bottom perspective views, respectively, showing a state in which the laminate substrate of FIG. 29 is processed to form a registration mark in accordance with the third embodiment of the present invention.

FIGS. 29 and 30 are cross-sectional views showing a process of forming a registration mark on a dielectric layer in accordance with an embodiment of the present invention.

FIG. 29 is a cross-sectional view of a laminate substrate that includes a dielectric layer 21 and a metal layer 25. The dielectric layer 21 typically is made of epoxy resin, glass-epoxy, polyimide or the like, and has a thickness of 0.5 mm in this embodiment. The metal layer 25 typically is made of copper, but copper alloys or other materials (such as aluminum, stainless steel or their alloys) may also be used. The thickness of the metal layer 25 can range from 5 to 200 microns. In this embodiment, the metal layer 25 is a copper plate with a thickness of 50 microns.

Figure 31:
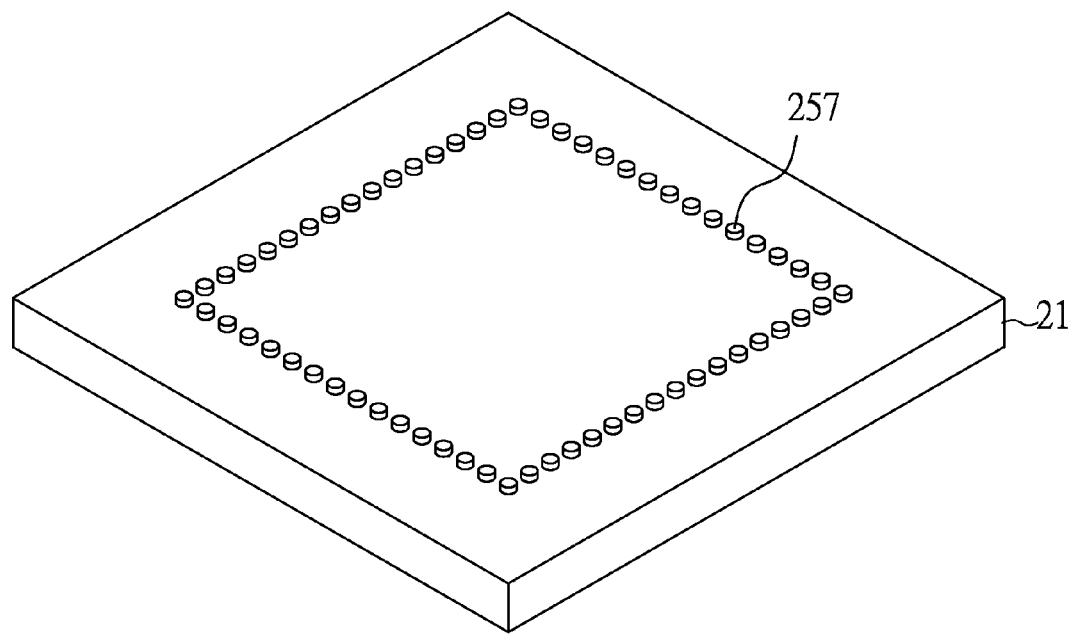

FIGS. 30 and 31 are cross-sectional and bottom perspective views, respectively, of the structure with a registration mark 257 formed on the dielectric layer 21. The registration mark 257 can be formed by removing selected portions of the metal layer 25 using photolithography and wet etching. As shown in FIG. 31, the registration mark 257 consists of plural metal posts in a rectangular frame array conforming to four lateral sides of a subsequently disposed interposer. However, the registration mark patterns are not limited thereto and can be in other various patterns against undesirable movement of the subsequently disposed interposer. For instance, the registration mark 257 may consist of a continuous or discontinuous strip and conform to four sides, two diagonal corners or four corners of a subsequently disposed interposer.

Figure 32:
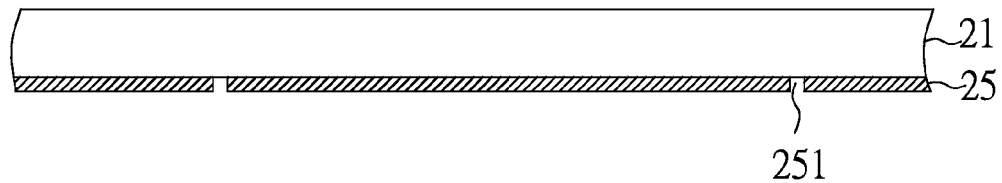
FIG. 32 is a cross-sectional view showing a laminate substrate with openings in accordance with the third embodiment of the present invention.
Figure 33:
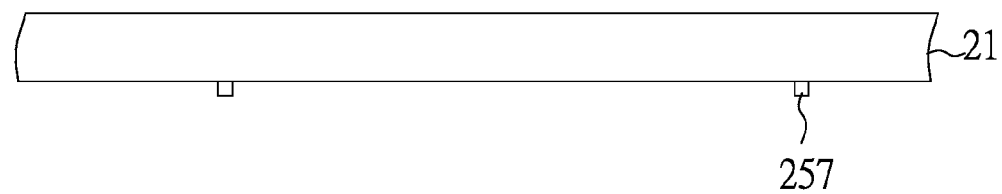
FIG. 33 is a cross-sectional view showing a state in which the laminate substrate of FIG. 32 is processed to form a registration mark in accordance with the third embodiment of the present invention.

FIGS. 32 and 33 are cross-sectional views showing an alternative process of forming a registration mark on a dielectric layer.

FIG. 32 is a cross-sectional view of a laminate substrate with a set of openings 251. The laminate substrate includes a dielectric layer 21 and a metal layer 25 as above mentioned, and the openings 251 are formed by removing selected portions of the metal layer 25.

FIG. 33 is a cross-sectional view of the structure with the registration mark 257 formed on the dielectric layer 21. The registration mark 257 can be formed by dispensing or printing a photosensitive plastic material (e.g., epoxy, polyimide, etc.) or non-photosensitive material into the openings 251, followed by removing the entire metal layer 25. Herein, the registration mark 257 consists of plural resin posts and has a pattern against undesirable movement of a subsequently disposed interposer.

Figure 34:
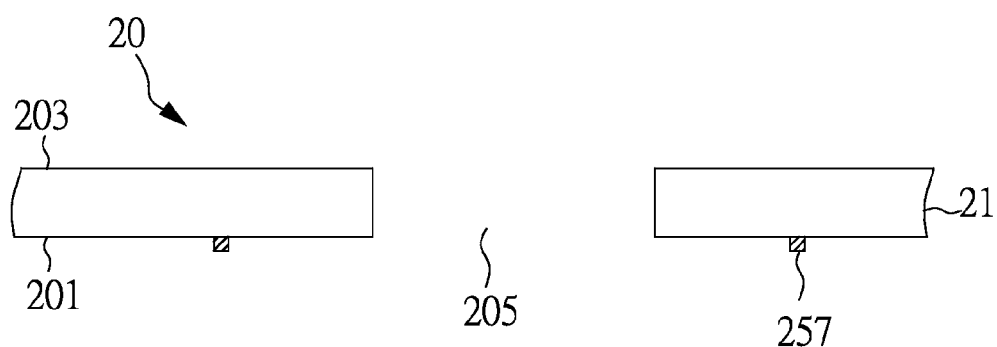
FIG. 34 is a cross-sectional view showing a state in which the laminate substrate of FIG. 30 is provided with a through opening to finish the fabrication of a base carrier in accordance with the third embodiment of the present invention.

FIG. 34 is a cross-sectional view of the base carrier 20 with a through opening 205. The through opening 205 extends through the dielectric layer 21 between the first surface 201 and the second surface 203 in the vertical direction.

Figure 35:
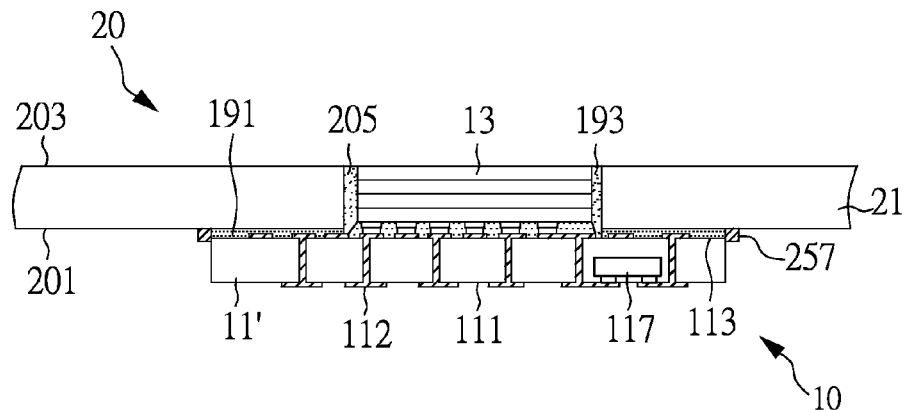
FIG. 35 is a cross-sectional view showing a state in which a chip-on-interposer subassembly is attached to the base carrier of FIG. 34 in accordance with the third embodiment of the present invention.

FIG. 35 is a cross-sectional view of the structure with a chip-on-interposer subassembly 10 attached to the base carrier 20 using an adhesive 191. The chip-on-interposer subassembly 10 is similar to that illustrated in FIG. 8, except that a single semiconductor device 13, illustrated as a 3D-stacked chip, is flip mounted on the interposer 11' and the interposer 11' further includes a passive component 117 embedded therein and electrically coupled to the first contact pads 112 in this embodiment. The semiconductor device 13 is positioned within the through opening 205, and the interposer 11' is located beyond the through opening 205 with its second surface 113 attached to the dielectric layer 21. The adhesive 191 contacts and is disposed between the second surface 113 of the interposer 11' and the first surface 201 of the base carrier 20. The registration mark 257 extends from the dielectric layer 21 and extends beyond the second surface 113 of the interposer 11' in the downward direction and is in close proximity to the peripheral edges of the interposer 11' to provide critical placement accuracy for the interposer 11'. Further, a filler material 193 is dispensed in the remaining space of the through opening 205 and surrounds the semiconductor device 13 and is essentially coplanar with the semiconductor device 13 and the base carrier 20 in the upward direction.

Figure 36:
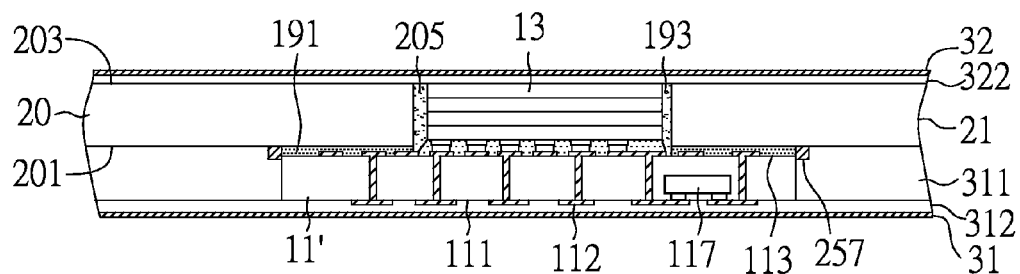
FIG. 36 is a cross-sectional view showing a state in which laminated layers are disposed on the structure of FIG. 35 in accordance with the third embodiment of the present invention.

FIG. 36 is a cross-sectional view of the structure with a balancing layer 311, a first insulating layer 312 and a first metal sheet 31 laminated/coated on the interposer 11' and the base carrier 20 from below, and a second insulating layer 322 and a second metal sheet 32 laminated/coated on the semiconductor device 13 and the base carrier 20 from above. The balancing layer 311 contacts and extends from the first surface 201 of the base carrier 20 in the downward direction and laterally covers and surrounds and conformally coats the sidewalls of the interposer 11' and extends laterally from the interposer 11' to the peripheral edges of the structure. The first insulating layer 312 contacts and provides robust mechanical bonds between the first metal sheet 31 and the interposer 11' and between the first metal sheet 31 and the balancing layer 311. The second insulating layer 322 contacts and covers and extends laterally on the semiconductor devices 13, the filler material 193 and the second surface 203 of the base carrier 20 in the upward direction. The second metal sheet 32 contacts and covers the second insulating layer 322 in the upward direction.

Figure 37:
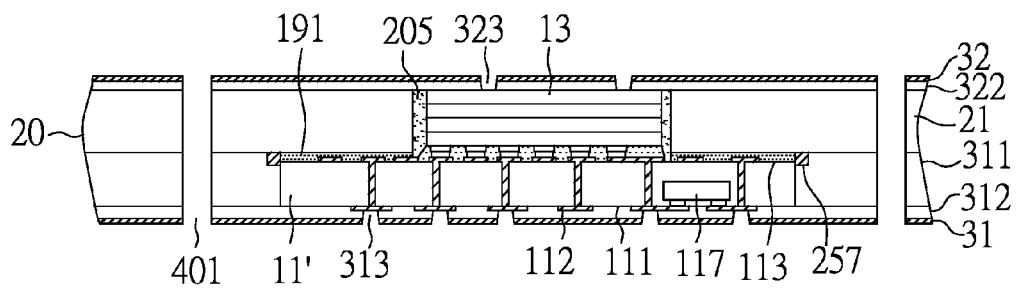
FIG. 37 is a cross-sectional view showing a state in which the structure of FIG. 36 is provided with via openings and through holes in accordance with the third embodiment of the present invention.

FIG. 37 is a cross-sectional view of the structure provided with first via openings 313, second via openings 323 and through holes 401. The first via openings 313 extend through the first metal sheet 31 and the first insulating layer 312 and are aligned with the first contact pads 112 of the interposer 11'. The second via openings 323 extend through the second metal sheet 32 and the second insulating layer 322 and are aligned with the semiconductor device 13. The through holes 401 extend though the first metal sheet 31, the first insulating layer 312, the balancing layer 311, the base carrier 20, the second insulating layer 322 and the second metal sheet 32 in vertical direction.

Figure 38:
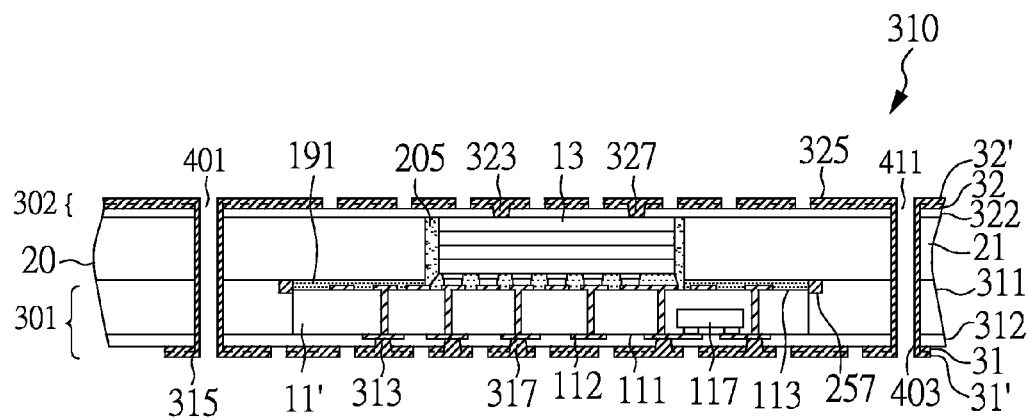
FIG. 38 is a cross-sectional view showing a state in which the structure of FIG. 37 is provided with conductive traces and plated through holes to finish the fabrication of a semiconductor package in accordance with the third embodiment of the present invention.

Referring now to FIG. 38, the first conductive traces 315 and the second conductive traces 325 are respectively formed on the first insulating layer 312 and the second insulating layer 322 by depositing a first plated layer 31' on the first metal sheet 31 and into the first via openings 313, depositing a second plated layer 32' on the second metal sheet 32 and into the second via openings 323, and then patterning the first and second metal sheets 31, 32 as well as the first and second plated layers 31', 32' thereon. Also, a connecting layer 403 is deposited in the through holes 401 to provide the plated through holes 411. The first conductive traces 315 extend from the first contact pads 112 of the interposer 11' in the downward direction, fill up the first via openings 313 to form first conductive vias 317 in direct contact with the first contact pads 112 of the interposer 11', and extend laterally on the first insulating layer 312, thereby providing signal routings for the interposer 11'. The second conductive traces 325 extend from the semiconductor device 13 in the upward direction, fill up the second via openings 323 to form second conductive vias 327 in direct contact with the semiconductor device 13 for thermal dissipation, and extend laterally on the second insulating layer 322. The plated through holes 411 at the first end extend to the first conductive traces 315 and at the second end extend to the second conductive traces 325 to provide a vertical signal connection pathway.

Accordingly, as shown in FIG. 38, a semiconductor package 310 is accomplished and includes an interposer 11', a semiconductor device 13, a base carrier 20, a first buildup circuitry 301, a second buildup circuitry 302 and plated through holes 411. In this illustration, the first buildup circuitry 301 includes a balancing layer 311, a first insulating layer 312 and first conductive traces 315; and the second buildup circuitry 302 includes a second insulating layer 322 and second conductive traces 325. The semiconductor device 13 is electrically coupled to the pre-fabricated interposer 11' by flip chip process to form a chip-on-interposer subassembly 10. The chip-on-interposer subassembly 10 is attached to the base carrier 20 using an adhesive 191 with the semiconductor device 13 positioned within the through opening 205 and the interposer 11' laterally extending beyond the through opening 205. The registration mark 257 of the base carrier 20 extends beyond the second surface 113 of the interposer 11' in the downward direction and is in close proximity to the peripheral edges of the interposer 11' to provide critical placement accuracy for the interposer 11'. The first buildup circuitry 301 is electrically coupled to the interposer 11' through the first conductive vias 317. The second buildup circuitry 302 is thermally conductible to the semiconductor device 13 through the second conductive vias 327 and is electrically connected to the first buildup circuitry 301 through the plated through holes 411. The plated through holes 411 at the first end extend to the first conductive traces 315 and at the second end extend to the second conductive traces 325.

Figure 39:
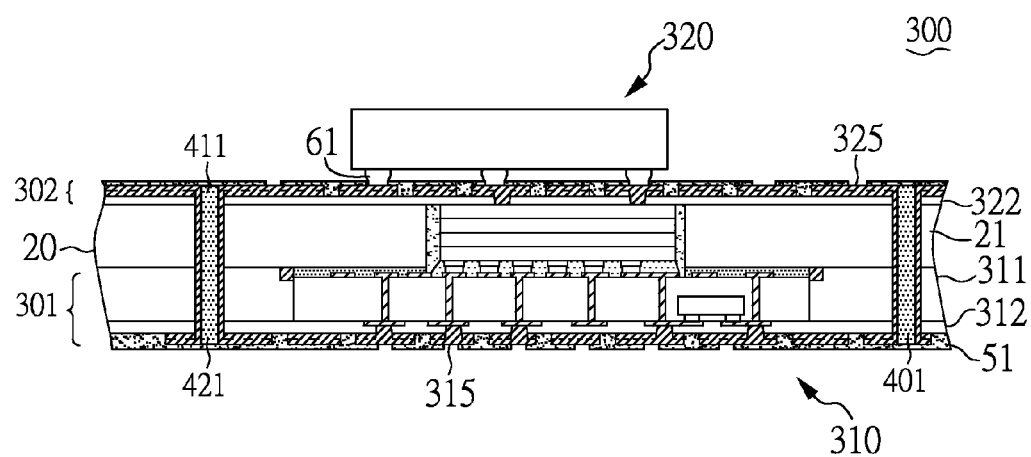
FIG. 39 is a cross-sectional view showing a package-on-package assembly with another semiconductor package mounted on the semiconductor package of FIG. 38 in accordance with the third embodiment of the present invention.

FIG. 39 is a cross-sectional view of a package-on-package assembly 300 with another semiconductor package 320 mounted on the second buildup circuitry 302 of the semiconductor package 310 illustrated in FIG. 38. In this illustration, the semiconductor package 310 is further provided with an insulative filler 421 in the remaining space of the through holes 401 and solder mask material 51 on the first and second buildup circuitries 301, 302. The solder mask material 51 includes solder mask openings to expose selected portions of the first and second conductive traces 315, 325. Accordingly, the semiconductor package 320 is mounted on the exposed portions of the second conductive traces 325 of the semiconductor package 310 via solder balls 61.

Embodiment 4

FIGS. 40-47 are schematic views showing a method of making yet another semiconductor package with package-on-package stacking capability in which the first buildup circuitry is electrically coupled to the base carrier for ground connection in accordance with yet another embodiment of the present invention.

For purposes of brevity, any description in the aforementioned Embodiments is incorporated herein insofar as the same is applicable, and the same description need not be repeated.

Figure 40:
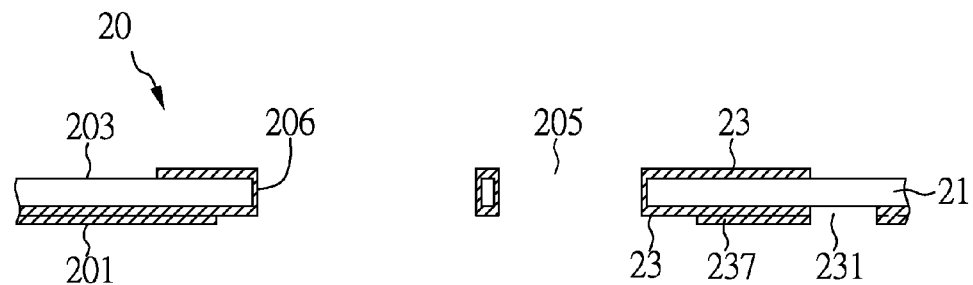
FIG. 40 is a cross-sectional view showing a base carrier in accordance with the fourth embodiment of the present invention.

FIG. 40 is a cross-sectional view of a base carrier 20 having through openings 205 and a registration mark 237. The through openings 205 extend through the base carrier 20 between the first surface 201 and the second surface 203 thereof, and the registration mark 237 is formed on the first surface 201. In this embodiment, the base carrier 20 includes a conductive layer 23 on the sidewalls of the through openings 205 as well as the opposite surfaces of a dielectric layer 21 having a thickness of about 0.5 mm. As such, the through openings 205 have shielding sidewalls 206 and can provide lateral EMI shielding effect for subsequently disposed semiconductor devices within the through openings 205. The registration mark 237 with a thickness of 50 microns extends from the lower part of the conductive layer 23 of the base carrier 20 in the downward direction and has inner peripheral edges that conform to the four lateral sides of a subsequently disposed interposer. In this illustration, the upper part of the conductive layer 23 is spaced from the peripheral edges of the base carrier 20, whereas the lower part of the conductive layer 23 as well as the registration mark 237 thereon laterally extends to the peripheral edges of the base carrier 20 and has an opening 231 formed at predetermined locations for subsequent formation of a plated through hole.

Figure 41:
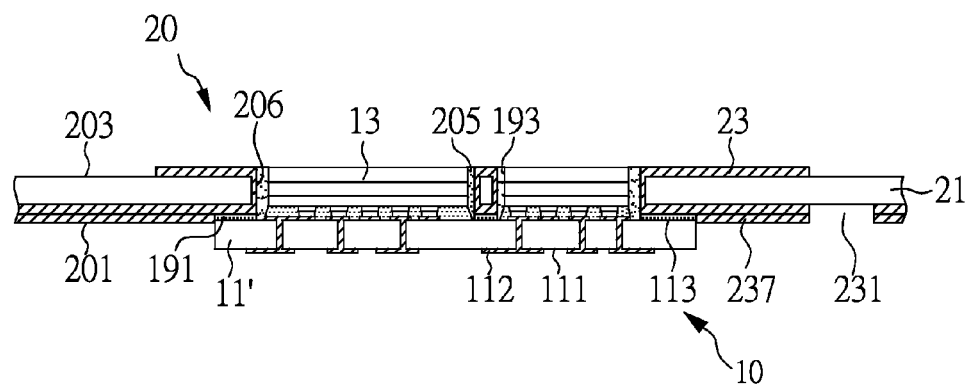
FIG. 41 is a cross-sectional view showing a state in which a chip-on-interposer subassembly is attached to the base carrier of FIG. 40 in accordance with the fourth embodiment of the present invention.

FIG. 41 is a cross-sectional view of the structure with a chip-on-interposer subassembly 10 attached to the base carrier 20 using an adhesive 191. The chip-on-interposer subassembly 10 is similar to that illustrated in FIG. 8, except that the semiconductor devices 13 are illustrated as 3D-stacked chips in this embodiment. The semiconductor devices 13 are positioned within the through openings 205, and the interposer 11' is located beyond the through openings 205 with its second surface 113 attached to the base carrier 20. The adhesive 191 contacts and is disposed between the second surface 113 of the interposer 11' and the low part of the conductive layer 23 of the base carrier 20. The registration mark 237 extends from the lower part of the conductive layer 23 and extends beyond the second surface 113 of the interposer 11' in the downward direction and is in close proximity to the peripheral edges of the interposer 11' to provide critical placement accuracy for the interposer 11'. Further, a filler material 193 is dispensed in the remaining space of the through opening 205 and surrounds the semiconductor devices 13 and is essentially coplanar with the semiconductor device 13 and the base carrier 20 in the upward direction.

Figure 42:
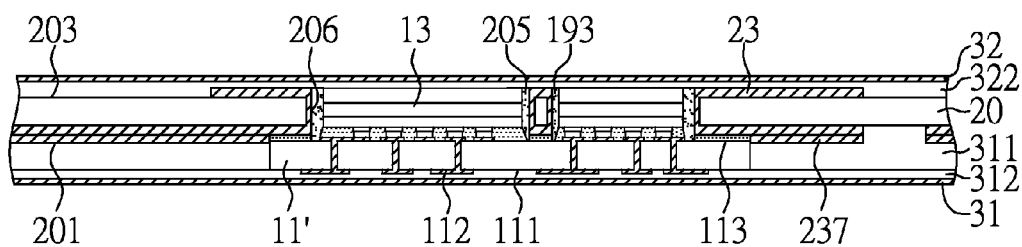
FIG. 42 is a cross-sectional view showing a state in which laminated layers are disposed on the structure of FIG. 41 in accordance with the fourth embodiment of the present invention.

FIG. 42 is a cross-sectional view of the structure with a balancing layer 311, a first insulating layer 312 and a first metal sheet 31 laminated/coated on the interposer 11' and the base carrier 20 from below, and a second insulating layer 322 and a second metal sheet 32 laminated/coated on the semiconductor devices 13 and the base carrier 20 from above. The balancing layer 311 contacts and extends from the first surface 201 of the base carrier 20 in the downward direction and laterally covers and surrounds and conformally coats the sidewalls of the interposer 11' and extends laterally from the interposer 11' to the peripheral edges of the structure. The first insulating layer 312 contacts and provides robust mechanical bonds between the first metal sheet 31 and the interposer 11' and between the first metal sheet 31 and the balancing layer 311. The second insulating layer 322 contacts and covers and extends laterally on the semiconductor devices 13, the filler material 193 and the second surface 203 of the base carrier 20 in the upward direction. The second metal sheet 32 contacts and covers the second insulating layer 322 in the upward direction.

Figure 43:
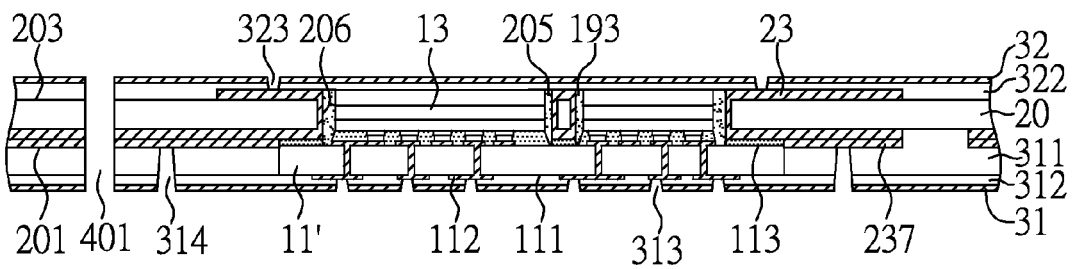
FIG. 43 is a cross-sectional view showing a state in which the structure of FIG. 42 is provided with via openings and a through hole in accordance with the fourth embodiment of the present invention.

FIG. 43 is a cross-sectional view of the structure provided with first via openings 313, 314, second via openings 323 and a through hole 401. The first via openings 313 extend through the first metal sheet 31 and the first insulating layer 312 and are aligned with the first contact pads 112 of the interposer 11'. The additional first via openings 314 extend through the first metal sheet 31, the first insulating layer 312 and the balancing layer 311 and are aligned with the registration mark 237. The second via openings 323 extend through the second metal sheet 32 and the second insulating layer 322 and are aligned with the upper part of the conductive layer 23. The through hole 401 extends though the first metal sheet 31, the first insulating layer 312, the balancing layer 311, the base carrier 20, the second insulating layer 322 and the second metal sheet 32 in vertical direction.

Figure 44:
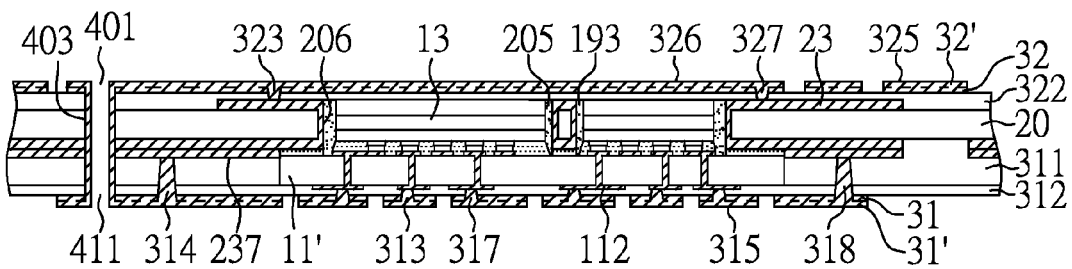
FIG. 44 is a cross-sectional view showing a state in which the structure of FIG. 43 is provided with conductive traces and a plated through hole in accordance with the fourth embodiment of the present invention.

Referring now to FIG. 44, a first plated layer 31' and a second plated layer 32' are respectively deposited on the first metal sheet 31 and the second metal sheet 32 and into the first and second via openings 313, 314 323, followed by patterning the first and second metal sheets 31, 32 as well as the first and second plated layers 31', 32' thereon to form first conductive traces 315, second conductive traces 325 and a metal shield 326. Also, a connecting layer 403 is deposited in the through hole 401 to provide a plated through hole 411. The first conductive traces 315 extend from the first contact pads 112 of the interposer 11' and the registration mark 237 in the downward direction, fill up the first via openings 313, 314 to form first conductive vias 317, 318 in direct contact with the first contact pads 112 of the interposer 11' and the registration mark 237, and extend laterally on the first insulating layer 312, thereby providing signal routings for the interposer 11' and ground connection. The second conductive traces 325 extend from the second insulating layer 322 in the upward direction and extend laterally on the second insulating layer 322. The metal shield 326 extends from the upper part of the conductive layer 23 in the upward direction, fills up the second via openings 323 to form second conductive traces 327 in direct contact with the base carrier 20 for ground connection, and extends laterally on the second insulating layer 322. The plated through hole 411 at the first end extends to the first conductive traces 315 and at the second end extends to the metal shield 326. As a result, the plated through hole 411 can provide extra ground connection pathway for the shielding sidewalls 206 and the metal shield 326.

Figure 45:
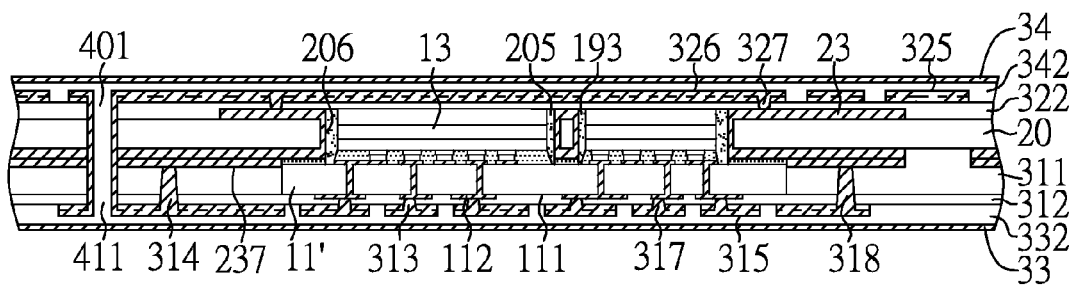
FIG. 45 is a cross-sectional view showing a state in which laminated layers are disposed on the structure of FIG. 44 in accordance with the fourth embodiment of the present invention.

FIG. 45 is a cross-sectional view of the structure with a third insulating layer 332 and a third metal sheet 33 laminated/coated on the first insulating layer 312 and the first conductive traces 315 from below, and a fourth insulating layer 342 and a fourth metal sheet 34 laminated/coated on the second insulating layer 322, the second conductive traces 325 and the metal shield 326 from above. The third insulating layer 332 is sandwiched between the first insulating layer 312/the first conductive traces 315 and the third metal sheet 33 and extends into the remaining space of the through hole 401. Likewise, the fourth insulating layer 342 is sandwiched between the second insulating layer 322/the second conductive traces 325/the metal shield 326 and the fourth metal sheet 34 and extends into the remaining space of the through holes 401.

Figure 46:
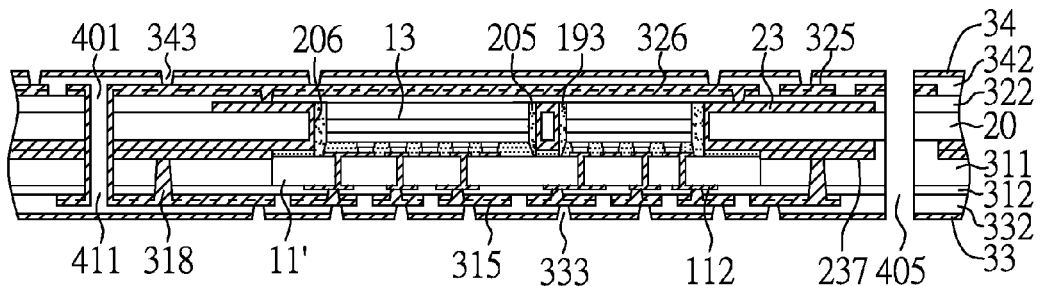
FIG. 46 is a cross-sectional view showing a state in which the structure of FIG. 45 is provided with via openings and a through hole in accordance with the fourth embodiment of the present invention.

FIG. 46 is a cross-sectional view of the structure provided with the third via openings 333, fourth via openings 343 and a through hole 405. The third via openings 333 extend through the third metal sheet 33 and the third insulating layer 332 to expose selected portions of the first conductive traces 315. The fourth via openings 343 extend through the fourth metal sheet 34 and the fourth insulating layer 342 to expose selected portions of the second conductive traces 325 and the metal shield 326. The through hole 405 extends though the third metal sheet 33, the third insulating layer 332, the first insulating layer 312, the balancing layer 311, the base carrier 20, the second insulating layer 322, the fourth insulating layer 342 and the fourth metal sheet 34 in vertical direction.

Figure 47:
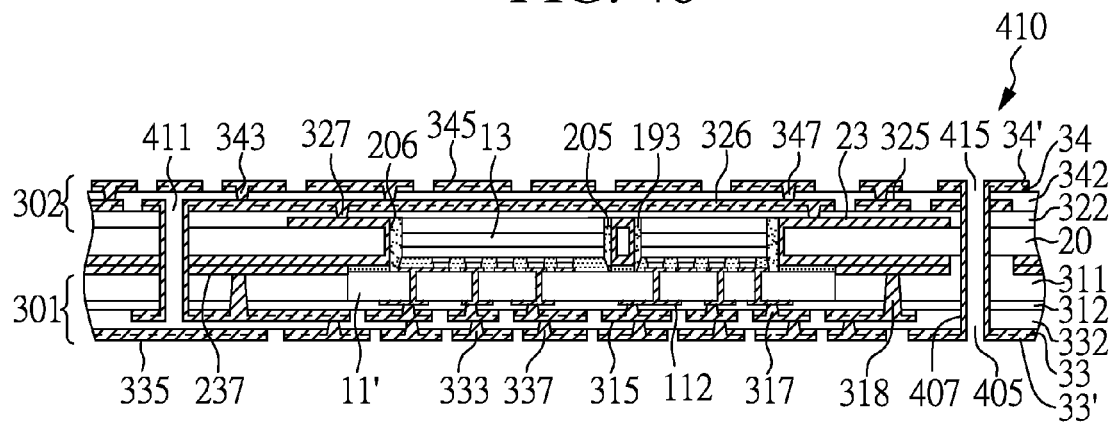
FIG. 47 is a cross-sectional view showing a state in which the structure of FIG. 46 is provided with conductive traces and a plated through hole to finish the fabrication of a semiconductor package in accordance with the fourth embodiment of the present invention.

Referring now to FIG. 47, the third conductive traces 335 and fourth conductive traces 345 are respectively formed on the third insulating layer 332 and the fourth insulating layer 342 by depositing a third plated layer 33' on the third metal sheet 33 and into the third via openings 333, depositing a fourth plated layer 34' on the fourth metal sheet 34 and into the fourth via openings 343, and then patterning the third and fourth metal sheets 33, 34 as well as the third and fourth plated layers 33', 34' thereon. Also, a connecting layer 407 is deposited in the through hole 405 to provide a plated through hole 415. The third conductive traces 335 extend from the first conductive traces 315 in the downward direction, fill up the third via openings 333 to form the third conductive vias 337 in direct contact with the first conductive traces 315, and extend laterally on the third insulating layer 332. The fourth conductive traces 345 extend from the second conductive traces 325 and the metal shield 326 in the upward direction, fill up the fourth via openings 343 to form the fourth conductive vias 347 in direct contact with the second conductive traces 325 and the metal shield 326, and extend laterally on the fourth insulating layer 342. The plated through hole 415 at the first end extends to the third conductive traces 335 and at the second end extends to the fourth conductive traces 345 to provide a vertical signal connection pathway.

Accordingly, as shown in FIG. 47, a semiconductor package 410 is accomplished and includes an interposer 11', semiconductor devices 13, a base carrier 20, a first buildup circuitry 301, a second buildup circuitry 302, and plated through holes 411, 415. In this illustration, the first buildup circuitry 301 includes a balancing layer 311, a first insulating layer 312, first conductive traces 315, a third insulating layer 332 and third conductive traces 335; and the second buildup circuitry 302 includes a second insulating layer 322, second conductive traces 325, a metal shield 326, a fourth insulating layer 342 and fourth conductive traces 345. The semiconductor devices 13 are electrically coupled to the pre-fabricated interposer 11' by flip chip process to form a chip-on-interposer subassembly 10. The chip-on-interposer subassembly 10 is attached to the base carrier 20 with the semiconductor devices 13 positioned within the through openings 205 and the interposer 11' laterally extending beyond the through openings 205. The base carrier 20 has the registration mark 237 that extends beyond the second surface 113 of the interposer 11' in the downward direction and is in close proximity to the peripheral edges of the interposer 11' to provide critical placement accuracy for the interposer 11'. The first buildup circuitry 301 is electrically coupled to the first contact pads 112 of the interposer 11' by the first conductive vias 317 for signal routing and also is electrically coupled to the registration mark 237 by the additional first conductive vias 318 for ground connection. The through openings 205 of the base carrier 20 have the shielding sidewalls 206 that laterally enclose and completely cover the semiconductor devices 13 in the lateral directions. The metal shield 326 of the second buildup circuitry 302 completely covers the semiconductor devices 13 in the upward direction and is electrically connected to the shielding sidewalls 206 through the second conductive vias 327 in direct contact with the upper part of the conductive layer 23 for ground connection. The plated through hole 411 vertically extends to the first conductive traces 315 at the first end and to the metal shield 326 at the second end to provide extra ground connection pathway for the shielding sidewalls 206 and the metal shield 326. The additional plated through hole 415 vertically extends to the third conductive traces 335 at the first end and to the fourth conductive traces 345 at the second end to provide the semiconductor package 410 with stacking capacity.

Figure 48:
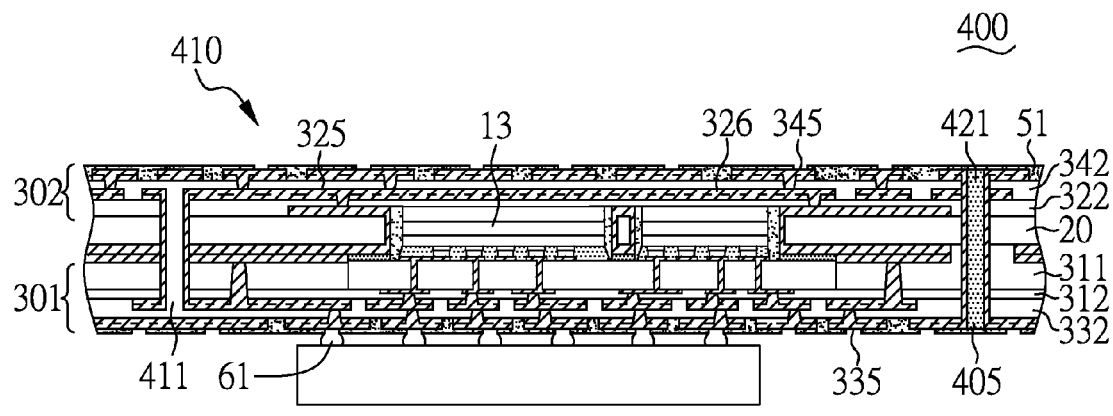
FIG. 48 is a cross-sectional view showing a package-on-package assembly with another semiconductor package mounted on the semiconductor package of FIG. 47 in accordance with the fourth embodiment of the present invention.

FIG. 48 is a cross-sectional view of a package-on-package assembly 400 with another semiconductor package 420 mounted on the first buildup circuitry 301 of the semiconductor package 410 illustrated in FIG. 47. In this illustration, the semiconductor package 410 is further provided with an insulative filler 421 in the remaining space of the through holes 405 and solder mask material 51 on the first and second buildup circuitries 301, 302. The solder mask material 51 includes solder mask openings to expose selected portions of the third and fourth conductive traces 335, 345. Accordingly, the semiconductor package 420 is mounted on the exposed portions of the third conductive traces 335 of the semiconductor package 410 via solder balls 61.

The packages and assemblies described above are merely exemplary. Numerous other embodiments are contemplated. In addition, the embodiments described above can be mixed-and-matched with one another and with other embodiments depending on design and reliability considerations. The semiconductor device can share or not share the through opening with other semiconductor devices. For instance, a through opening can accommodate a single semiconductor device, and the base carrier can include multiple through openings arranged in an array for multiple semiconductor devices. Alternatively, numerous semiconductor devices can be positioned within a single through opening. Likewise, a semiconductor device can share or not share the interposer with other semiconductor devices. For instance, a single semiconductor device can be electrically connected to the interposer. Alternatively, numerous semiconductor devices may be coupled to the same interposer. For instance, four small semiconductor devices in a 2×2 array can be coupled to the interposer and the interposer can include additional contact pads to receive and route additional device pads. Also, the buildup circuitry can include additional conductive traces to accommodate additional contact pads of the interposer.

As illustrated in the aforementioned embodiments, a distinctive semiconductor package is configured to exhibit improved reliability, which includes a semiconductor device, an interposer, a base carrier, a first buildup circuitry, a second buildup circuitry and plated through holes.

The semiconductor device is electrically coupled to the interposer by a plurality of bumps to form a chip-on-interposer subassembly. The semiconductor device can be a packaged or unpackaged chip. For instance, the semiconductor device can be a bare chip, or a wafer level packaged die, etc. Alternatively, the semiconductor device can be a stacked-die chip. Subsequently, the chip-on-interposer subassembly is attached to the base carrier using an adhesive that can be first dispensed on the first surface of the base carrier and then contacts the second surface of the interposer when inserting the semiconductor device into the through opening of the base carrier. Accordingly, the adhesive can provide mechanical bonds between the interposer and the base carrier. Further, a filler material can be further provided to fill the gap between the semiconductor device and the base carrier within the through opening.

The base carrier can extend to the peripheral edges of the semiconductor package and serves as a platform for the chip-on-interposer subassembly attachment. The base carrier preferably has a thickness of 0.1 mm to 1 mm and has a through opening with the same dimension at the first surface as at the second surface thereof. The base carrier can be made of non-metallic materials, such as various inorganic or organic insulating materials including ceramics, aluminum oxide ($Al_2O_3$), aluminum nitride (AlN), silicon nitride (SiN), silicon (Si), glass, laminated epoxy, polyimide copper-clad laminate or other dielectric materials. Optionally, the base carrier may be deposited with a conductive layer (such as a copper layer) on sidewalls of the through opening as well as the first and second surfaces thereof. Accordingly, the through opening of base carrier can have shielding sidewalls that laterally cover peripheral edges of the semiconductor device to provide lateral EMI shielding effect for the semiconductor device within the through opening. In order to provide effective lateral EMI shielding, the shielding sidewalls of the base carrier preferably completely cover the lateral surfaces of the semiconductor device and are electrically coupled to at least one of the first contact pads of the interposer for grounding through the first buildup circuitry to minimize the lateral electromagnetic interference. For instance, the shielding sidewalls may be electrically connected to the first buildup circuitry through a plated through hole that extends through the base carrier or through an additional first conductive via of the first buildup circuitry in electrical contact with the conductive layer or a registration mark on the first surface of the base carrier.

Moreover, the base carrier may include a registration mark on and projecting from its first surface for the interposer attachment. In a preferred embodiment, the registration mark extends from a flat surface of the base carrier and extends beyond the second surface of the interposer in the first vertical direction. For the convenience of description, the direction in which the first surface of the interposer faces is defined as the first vertical direction, and the direction in which the second surface of the interposer faces is defined as the second vertical direction. As such, the interposer placement accuracy can be provided by the registration mark that is laterally aligned with and in close proximity to the peripheral edges of the interposer The base carrier having a registration mark around one open end of the through opening can be fabricated by the steps of: forming a registration mark on a dielectric layer by removing a selected portion of a metal layer on the dielectric layer or by pattern deposition of a metal or a plastic material on the dielectric layer; and forming a through opening that extends through the dielectric layer with the registration mark positioned around one open end of the through opening. Likewise, the base carrier having a conductive layer on the sidewalls of the through opening as well as the first and second surfaces thereof can be provided with a registration mark on the conductive layer at the first surface thereof by a pattern deposition or pattern removal process as mentioned above.

The registration mark can be made of a metal, a photosensitive plastic material or non-photosensitive material. For instance, the registration mark can consist essentially of copper, aluminum, nickel, iron, tin or their alloys. The registration mark can also include or consist of epoxy or polyimide. Further, the registration mark can have various patterns against undesirable movement of the interposer. For instance, the registration mark can include a continuous or discontinuous strip or an array of posts. Alternatively, the registration mark may laterally extend to the peripheral edges of the base carrier and have inner peripheral edges that conform to the peripheral edges of the interposer. Specifically, the registration mark can be laterally aligned with four lateral surfaces of the interposer to define an area with the same or similar topography as the interposer and prevent the lateral displacement of the interposer. For instance, the registration mark can be aligned along and conform to four sides, two diagonal corners or four corners of the interposer, and the gaps in between the interposer and the registration mark preferably is in a range of about 5 to 50 microns. As a result, the registration mark located beyond the interposer can provide placement accuracy for the chip-on-interposer subassembly. Besides, the registration mark around the through opening preferably has a height in a range of 5-200 microns.

The interposer laterally extends beyond the through opening and can be attached to the base carrier with its second surface attached to a flat surface of the base carrier that is adjacent to and laterally extends from the first open end of the through opening. For the convenience of description, the open end of the through opening at the first surface of the base carrier is defined as the first open end, and the other open end of the through opening at the second surface of the base carrier is defined as the second open end. The interposer can be a silicon, glass, ceramic, graphite or resin material with a thickness of 50 to 500 microns, and can contain a pattern of traces that fan out from a finer pitch at the second contact pads to a coarser pitch at the first contact pads. Accordingly, the interposer can provide first level fan-out routing/interconnection for the semiconductor device. Additionally, as the interposer is typically made of a high elastic modulus material with CTE (coefficient of thermal expansion) approximately equal to that of the semiconductor device (for example, 3 to 10 ppm per degree Centigrade), internal stresses in chip and its electrical interconnection caused by CTE mismatch can be largely compensated or reduced. Further, the interposer may include one or more passive components embedded therein and electrically connected to the first contact pads of the interposer.

The first and second buildup circuitries are respectively disposed at both opposite sides of the package and can provide secondary fan-out routing/interconnection. The first buildup circuitry covers and contacts the first surface of the interposer and the first surface of the base carrier in the first vertical direction, whereas the second buildup circuitry covers and contacts the semiconductor device and the second surface of the base carrier in the second vertical direction. The first buildup circuitry includes a balancing layer, a first insulating layer and one or more first conductive traces. The second buildup circuitry includes a second insulating layer and one or more second conductive traces. The balancing layer laterally covers sidewalls of the interposer and the first insulating layer is deposited on the first surface of the interposer and the balancing layer. The second insulating layer covers the semiconductor device and the second surface of base carrier in the second vertical direction. The first conductive traces extend laterally on the first insulating layer and extend through first via openings in the first insulating layer to form first conductive vias in direct contact with the first contact pads of the interposer for signal routing and optionally with the conductive layer or the registration mark on the first surface of the base carrier for ground connection. Accordingly, the first conductive traces can directly contact the first contact pads to provide signal routing for the interposer, and thus the electrical connection between the interposer and the first buildup circuitry can be devoid of soldering material. The second conductive traces extend laterally on the second insulating layer, and may extend through one or more optional second via openings in the second insulating layers to form one or more second conductive vias in direct contact with the semiconductor device. As the second conductive vias in direct contact with the semiconductor device can serve as heat pipes, the heat generated from the semiconductor device can be dissipated to the outer conductive layer of the second buildup circuitry by the second conductive vias. Alternatively, the second buildup circuitry may further include a metal shield that is aligned with the semiconductor device. The metal shield extends laterally on the second insulating layer and preferably is a continuous metal layer that laterally extends outward at least to peripheral edges of the semiconductor device. For instance, the metal shield can laterally extend to be coplanar with peripheral edges of the semiconductor device in the lateral directions, or laterally extend beyond peripheral edges of the semiconductor device outward. Accordingly, the metal shield that completely covers the semiconductor device from the second vertical direction can minimize the vertical electromagnetic interference. The metal shield can be electrically connected to the first buildup circuitry for ground connection through a plated through hole that extends through the base carrier and is electrically coupled to the first buildup circuitry. Alternatively, the metal shield is electrically connected to the base carrier through a second conductive via of the second buildup circuitry in electrical contact with the conductive layer on the second surface of the base carrier and is further electrically connected to the first buildup circuitry through an additional first conductive via of the first buildup circuitry in electrical contact with the conductive layer on the first surface of the base carrier. As a result, the metal shield can be electrically coupled to at least one of the first contact pads of the interposer for grounding through the first buildup circuitry so as to provide effective vertical EMI shielding.

The first and second buildup circuitries can further include additional insulating layers, additional via openings, and additional conductive traces if needed for further signal routing. The outmost conductive traces of the first and second buildup circuitries can respectively accommodate conductive joints, such as solder balls, for electrical communication and mechanical attachment with another semiconductor package. Accordingly, a package-on-package assembly can be provided by mounting another semiconductor package on the first or second buildup circuitry using conductive joints on the outmost conductive traces.

The plated though holes can be shared by the base carrier and the first and second buildup circuitries or be formed in the base carrier between the first and second surfaces of the base carrier. For the aspect of the plated through hole formed in the base carrier, the base carrier has first and second patterned wiring layers respectively on the first and second surfaces thereof, and the plated through hole electrically coupled the first and second patterned wiring layers. Accordingly, the plated though hole at the first end can extend to and be electrically connected to an outer or inner conductive layer of the first buildup circuitry or to the first patterned wiring layer of the base carrier, and at the second end can extend to and be electrically connected to an outer or inner conductive layer or the metal shield of the second buildup circuitry or to the second patterned wiring layer of the base carrier. In any case, the plated through hole can provide electrical and thermal connections between the first buildup circuitry and the second buildup circuitry.

The plated through holes can be formed by the steps of: forming through holes that extend through the base carrier; and then depositing a connecting layer on inner sidewalls of the through holes. For the aspect of the plated through hole shared by the base carrier and the first and second buildup circuitries, the through holes can be provided after depositing the balancing layer and the first and second insulating layers and can extend through the base carrier, the balancing layer and one or more insulating layers of the buildup circuitries in the vertical direction. Further, the connecting layer of the plated through hole can be simultaneously deposited while forming the outer or inner conductive traces of the buildup circuitries.

The term "cover" refers to incomplete or complete coverage in a vertical and/or lateral direction. For instance, in the position that the first surface of the interposer faces the downward direction, the base carrier covers the interposer in the upward direction regardless of whether another element such as the adhesive is between the base carrier and the interposer.

The phrase "aligned with" refers to relative position between elements regardless of whether elements are spaced from or adjacent to one another or one element is inserted into and extends into the other element. For instance, the registration mark is laterally aligned with the interposer since an imaginary horizontal line intersects the registration mark and the interposer, regardless of whether another element is between the registration mark and the interposer and is intersected by the line, and regardless of whether another imaginary horizontal line intersects the interposer but not the registration mark or intersects the registration mark but not the interposer. Likewise, the first via opening is aligned with the first contact pads of the interposer.

The phrase "in close proximity to" refers to a gap between elements not being wider than a maximum acceptable limit. As known in the art, when the gap between the registration mark and the interposer is not narrow enough, the location error of the interposer due to the lateral displacement of the interposer within the gap may exceed the maximum acceptable error limit. In some cases, once the location error of the interposer goes beyond the maximum limit, it is impossible to align the predetermined portion of the interposer with a laser beam, resulting in the electrical connection failure between the interposer and the buildup circuitry. According to the pad size of the interposer, those skilled in the art can ascertain the maximum acceptable limit for a gap between the interposer and the registration mark through trial and error to ensure the conductive vias being aligned with the contact pads of the interposer. Thereby, the description "the registration mark is in close proximity to the peripheral edges of the interposer" means that the gap between the registration mark and the peripheral edges of the interposer is narrow enough to prevent the location error of the interposer from exceeding the maximum acceptable error limit.

The phrases "electrical connection", "electrically connected", "electrically coupled" and "electrically couples" refer to direct and indirect electrical connection. For instance, the first conductive traces directly contact and are electrically connected to the first contact pads of the interposer, and the third conductive traces are spaced from and electrically connected to the first contact pads of the interposer by the first conductive traces.

The "first vertical direction" and "second vertical direction" do not depend on the orientation of the package, as will be readily apparent to those skilled in the art. For instance, the first surface of the interposer faces the first vertical direction and the second surface of the interposer faces the second vertical direction regardless of whether the package is inverted. Likewise, the registration mark is "laterally" aligned with the interposer in a lateral plane regardless of whether the package is inverted, rotated or slanted. Thus, the first and second vertical directions are opposite one another and orthogonal to the lateral directions, and a lateral plane orthogonal to the first and second vertical directions intersects laterally aligned elements. Furthermore, the first vertical direction is the upward direction and the second vertical direction is the downward direction in the position that the first surface of the interposer faces the upward direction, and the first vertical direction is the downward direction and the second vertical direction is the upward direction in the position that the first surface of the interposer faces the downward direction.

The semiconductor package for package-on-package stacking applications according to the present invention has numerous advantages. For instance, the semiconductor device is electrically coupled to the interposer by a well-known flip chip bonding process such as thermo-compression or solder reflow, which can avoid the positional accuracy issue inherent in most stackable approaches where an adhesive carrier is used for temporary bonding. The interposer provides a first level fan-out routing/interconnection for the semiconductor device whereas the buildup circuitry provides a second level fan-out routing/interconnection. As the buildup circuitry is formed on the interposer designed with larger pad size and pitch space, the manufacturing yield is greatly improved compared to the conventional types where buildup circuitry is directly formed on the chip I/O pad without fan-out routing. The base carrier can provide a platform for attaching the interposer thereon with the semiconductor device positioned in the through opening of the base carrier. The registration mark can provide critical placement accuracy for the interposer. As such, the shape of the through opening that houses the semiconductor device is not a critical parameter that needs to be tightly controlled. The direct electrical connection without solder between the interposer and the buildup circuitry is advantageous to high I/O and high performance. The dual buildup circuitries can provide signal routing with simple circuitry patterns or flexible multi-layer signal routing with complex circuitry patterns. The plated through hole can provide vertical signal routing between the dual buildup circuitries, thereby providing the package with stacking capability. The package made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and the description may simplify or omit elements or steps well-known to those skilled in the art to prevent obscuring the present invention. Likewise, the drawings may omit duplicative or unnecessary elements and reference labels to improve clarity.

What is claimed is:

1. A method of making a semiconductor package with package-on-package stacking capability, comprising the steps of:
    providing a semiconductor device;
    providing an interposer that includes a first surface, a second surface opposite to the first surface, first contact pads on the first surface, second contact pads on the second surface, and through vias that electrically couple the first contact pads and the second contact pads;
    electrically coupling the semiconductor device to the second contact pads of the interposer by a plurality of bumps to form a chip-on-interposer subassembly;
    providing a base carrier having a first surface, an opposite second surface, and a through opening that extends through the base carrier between the first surface and the second surface thereof;
    attaching the chip-on-interposer subassembly to the base carrier using an adhesive with the semiconductor device inserted into the through opening and the interposer laterally extending beyond the through opening;
    with the chip-on-interposer subassembly attached to the base carrier, forming a first buildup circuitry on the first surface of the interposer and the first surface of the base carrier, wherein the first buildup circuitry is electrically coupled to the first contact pads of the interposer through first conductive vias of the first buildup circuitry;
    forming a second buildup circuitry on the semiconductor device and the second surface of the base carrier; and
    forming plated through holes that extend through the base carrier to provide electrical and thermal connections between the first buildup circuitry and the second buildup circuitry.

2. The method of claim 1, wherein the step of electrically coupling the semiconductor device to the second contact pads of the interposer is performed on a panel scale, and a singulation step is executed to separate individual chip-on-interposer subassemblies before the step of attaching the chip-on-interposer subassembly to the base carrier.

3. The method of claim 1, wherein the base carrier further includes a registration mark on and projecting from the first surface thereof, and the chip-on-interposer subassembly is attached to the base carrier with the registration mark laterally aligned with and in close proximity to peripheral edges of the interposer and extending beyond the second surface of the interposer.

4. The method of claim 1, wherein the through opening of the base carrier has shielding sidewalls that laterally cover peripheral edges of the semiconductor device.

5. The method of claim 4, wherein the second buildup circuitry comprises a metal shield that is aligned with the semiconductor device, and the metal shield and the shielding sidewalls are electrically coupled to at least one of the first contact pads of the interposer for grounding through the first buildup circuitry.

6. The method of claim 5, wherein the metal shield is a continuous metal layer and laterally extends outward at least to peripheral edges of the semiconductor device.

7. A semiconductor package with package-on-package stacking capability prepared by a method that comprises steps of:
    providing a semiconductor device;
    providing an interposer that includes a first surface, a second surface opposite to the first surface, first contact pads on the first surface, second contact pads on the second surface, and through vias that electrically couple the first contact pads and the second contact pads;
    electrically coupling the semiconductor device to the second contact pads of the interposer by a plurality of bumps to form a chip-on-interposer subassembly;
    providing a base carrier having a first surface, an opposite second surface, and a through opening that extends through the base carrier between the first surface and the second surface thereof;
    attaching the chip-on-interposer subassembly to the base carrier using an adhesive with the semiconductor device inserted into the through opening and the interposer laterally extending beyond the through opening;
    with the chip-on-interposer subassembly attached to the base carrier, forming a first buildup circuitry on the first surface of the interposer and the first surface of the base carrier, wherein the first buildup circuitry is electrically coupled to the first contact pads of the interposer through first conductive vias of the first buildup circuitry;
    forming a second buildup circuitry on the semiconductor device and the second surface of the base carrier; and
    forming plated through holes that extend through the base carrier to provide electrical and thermal connections between the first buildup circuitry and the second buildup circuitry.

8. A semiconductor package with package-on-package stacking capability, comprising:

a semiconductor device;

an interposer having a first surface, a second surface opposite to the first surface, first contact pads on the first surface, second contact pads on the second surface, and through vias that electrically couple the first contact pads and the second contact pads;

a base carrier having a first surface, an opposite second surface, and a through opening that extends through the base carrier between the first surface and the second surface;

a first buildup circuitry formed on the first surface of the interposer and the first surface of the base carrier, wherein the first buildup circuitry is electrically coupled to the first contact pads of the interposer through first conductive vias of the first buildup circuitry;

a second buildup circuitry formed on the semiconductor device and the second surface of the base carrier; and plated through holes that extend through the base carrier for providing electrical and thermal connections between the first buildup circuitry and the second buildup circuitry, wherein the semiconductor device is electrically coupled to the second contact pads of the interposer by a plurality of bumps to form a chip-on-interposer subassembly; and the chip-on-interposer subassembly is attached to the base carrier using an adhesive with the semiconductor device enclosed in the through opening and the interposer laterally extending beyond the through opening.

9. The semiconductor package with package-on-package stacking capability according to claim 8, wherein the base carrier further includes a registration mark on and projecting from the first surface thereof, and the registration mark is laterally aligned with and in close proximity to peripheral edges of the interposer and extends beyond the second surface of the interposer.

10. The semiconductor package with package-on-package stacking capability according to claim 8, wherein the through opening of the base carrier has shielding sidewalls that laterally cover peripheral edges of the semiconductor device.

11. The semiconductor package with package-on-package stacking capability according to claim 10, wherein the second buildup circuitry comprises a metal shield that is aligned with the semiconductor device, and the metal shield and the shielding sidewalls are electrically coupled to at least one of the first contact pads of the interposer for grounding through the first buildup circuitry.

12. The method of claim 11, wherein the metal shield is a continuous metal layer and laterally extends outward at least to peripheral edges of the semiconductor device.

\* \* \* \* \*